(12) United States Patent
Jiang et al.

(10) Patent No.: US 11,088,353 B2
(45) Date of Patent: Aug. 10, 2021

(54) SOLID-STATE TOTAL REFLECTION DISPLAY AND MANUFACTURE METHOD THEREOF, AND DISPLAY DEVICE

(71) Applicant: Shanghai Tianma Micro-Electronics Co., Ltd., Shanghai (CN)

(72) Inventors: Yongli Jiang, Shanghai (CN); Feng Lu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 57 days.

(21) Appl. No.: 16/669,534

(22) Filed: Oct. 31, 2019

(65) Prior Publication Data

US 2020/0067022 A1    Feb. 27, 2020

(30) Foreign Application Priority Data

Jun. 19, 2019    (CN) .......................... 201910533717.5

(51) Int. Cl.
| | | |
|---|---|---|
| *H01L 51/52* | (2006.01) | |
| *H01L 27/32* | (2006.01) | |
| *H01L 51/56* | (2006.01) | |

(52) U.S. Cl.
CPC ...... *H01L 51/5265* (2013.01); *H01L 27/3258* (2013.01); *H01L 51/5271* (2013.01); *H01L 51/56* (2013.01)

(58) Field of Classification Search
CPC ....... H01L 33/58; H01L 27/3244–3279; H01L 51/5262–5278
See application file for complete search history.

(56) References Cited

U.S. PATENT DOCUMENTS

| | | | | |
|---|---|---|---|---|
| 2005/0226294 A1* | 10/2005 | Ledentsov | ............ | H01L 33/105 372/44.01 |
| 2008/0303419 A1* | 12/2008 | Fukuda | ............... | H01L 27/3246 313/504 |
| 2014/0319571 A1* | 10/2014 | Hakuta | .................. | H01L 33/46 257/98 |
| 2017/0199400 A1* | 7/2017 | Mok | ................. | G02F 1/136286 |
| 2017/0205959 A1* | 7/2017 | Seong | .................. | G06F 3/0448 |
| 2017/0271421 A1* | 9/2017 | Jinbo | .................. | H01L 51/5253 |

* cited by examiner

*Primary Examiner* — Stephen M Bradley
(74) *Attorney, Agent, or Firm* — Kilpatrick Townsend & Stockton, LLP

(57) ABSTRACT

The disclosure recites a solid-state total reflection display and a manufacture method thereof, and a display device. The solid-state total reflection display includes: a drive circuit layer, and a heating layer and a pixel function layer stacked successively on the drive circuit layer; a plurality of pixel structures in the pixel function layer are arranged in an array, and the pixel structures each includes a reflection layer, a resonant cavity layer, a phase change material layer and a transparent covering layer stacked successively; a plurality of light adjusting structures are arranged between two adjacent pixel structures among the plurality of pixel structures in a row or column direction of the array; a side of each light adjusting structure towards an ambient light-entering side of the solid-state total reflection display is in a concave shape.

21 Claims, 19 Drawing Sheets

SOLID-STATE TOTAL REFLECTION DISPLAY AND MANUFACTURE METHOD THEREOF, AND DISPLAY DEVICE

CROSS-REFERENCE TO RELATED APPLICATION

This application claims priority of Chinese Patent Application No. 201910533717.5, filed on Jun. 19, 2019, which is hereby incorporated by reference in its entirety.

FIELD

The present disclosure relates to the field of display technologies and particularly to a solid-state total reflection display and a manufacture method thereof, and a display device.

BACKGROUND

In the field of display technologies, the liquid crystal display and the OLED display are both very common, where the liquid crystal display performs the display by using the backlight source, while the OLED display performs the display by the self-luminescence.

There is also a solid-state total reflection display, which is not self-luminous and does not use the backlight source, but implements the display by reflecting the ambient light incident on the solid-state total reflection display from the outside.

However, in order to reduce the thickness of the solid-state total reflection display, generally no shield structure (such as black border) is arranged among the individual pixels of the solid-state total reflection display, so that a part of the light reaching the drive circuit layer may be reflected by the metal lines in the drive circuit layer after the external light is incident into the solid-state total reflection display, to thereby cause the interference on the displaying of the solid-state total reflection display and degrade the display effect.

In view of this, how to reduce the interference of the ambient light on the solid-state total reflection display effectively without the increase in the thickness of the solid-state total reflection display, becomes a problem to be solved.

SUMMARY

Embodiments of the disclosure provide a solid-state total reflection display and a manufacture method thereof, and a display device, so as to solve the problem in the prior art that the solid-state total reflection display is affected by the ambient light to degrade the display effect.

In one embodiment, in order to solve the above-mentioned problem, an embodiment of the disclosure provides a solid-state total reflection display, which includes:

a drive circuit layer;

a heating layer and a pixel function layer stacked successively on the drive circuit layer; a plurality of pixel structures in the pixel function layer being arranged in an array, and the pixel structures each including a reflection layer, a resonant cavity layer, a phase change material layer and a transparent covering layer stacked successively; and a plurality of light adjusting structures arranged between two adjacent pixel structures, among the plurality of pixel structures, in a row or column direction of the array; a side of each light adjusting structure towards an ambient light-entering side of the solid-state total reflection display being in a concave shape.

In one embodiment, provided is a method for manufacturing the solid-state total reflection display as described in the above embodiment, where the method includes:

providing a drive circuit layer and a heating layer arranged opposite to the drive circuit layer;

forming a first insulating transparent layer between the drive circuit layer and the heating layer;

etching a plurality of light adjusting structures arranged in an array on the first insulating transparent layer by an etching process, where a side of each light adjusting structure towards an ambient light-entering side of the solid-state total reflection display is in a concave shape, which is used to totally reflect ambient light incident on the each light adjusting structure so that the ambient light cannot emit from the each light adjusting structure or emits outside a range of visibility of a user; and forming a second insulating transparent layer and a pixel function layer successively on a lateral surface of the heating layer far away from the drive circuit layer, where pixel structures in the pixel function layer are arranged in an array, and the pixel structures each includes a reflection layer, a resonant cavity layer, a phase change material layer and a transparent covering layer stacked successively.

One embodiment of the disclosure provides a display device which includes the solid-state total reflection display as described in the embodiments.

DETAILED DESCRIPTION OF THE EMBODIMENTS

Embodiments of the disclosure provide a solid-state total reflection display and a manufacture method thereof, and a display device, and the problem of the solid-state total reflection display is affected by the ambient light to degrade the display effect.

The same reference numbers represent the same or similar structures in the figures, so the repeated description thereof will be omitted. The words expressing the positions and directions described in the disclosure are all intended to illustrate by taking the drawings as examples, but can also be changed as needed, where the changes made are all contained in the protection scope of the disclosure. The drawings of the disclosure are merely intended to illustrate the relative position relationship, but not represent the real proportion.

The solid-state total reflection display and the manufacture method thereof, and the display device according to the embodiments of the disclosure will be illustrated below specifically in combination with the drawings.

Figure 1:
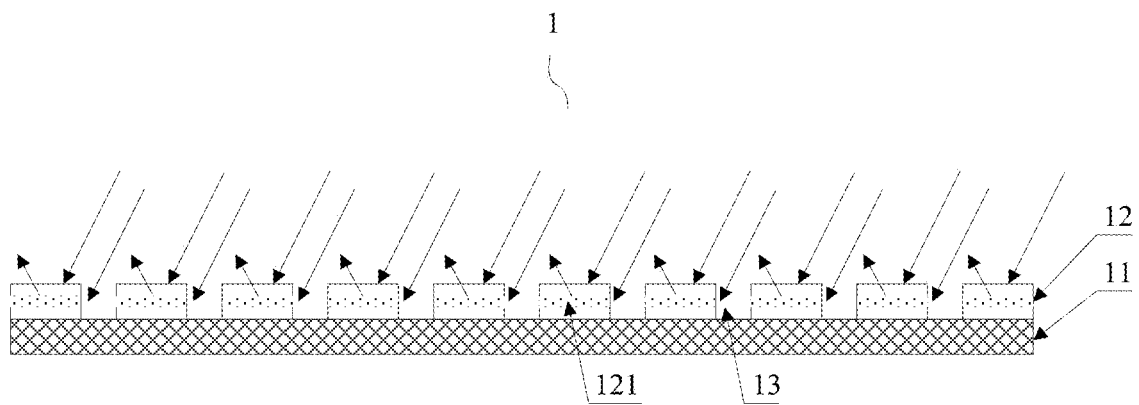
FIG. 1 is a structural schematic diagram of a solid-state total reflection display in the related art.

As shown in FIG. 1, FIG. 1 is a structural schematic diagram of a solid-state total reflection display in the related art.

The solid-state total reflection display 1 includes a substrate 11, and a plurality of pixel units 12 spaced from each other and arranged in an array on the substrate 11. The pixel unit 12 includes the Phase Change Material (PCM) 121. The external light irradiates the phase change material 121, and the phase change material 121 can change the color of the reflected light according to the transformation of the molecular structure between the crystallization and the non-crystallization, so that the user sees that the solid-state total reflection display 1 shows different colors.

The inventor found after study that after the incident light enters the pixel interval 13 between the pixel units 12, the pixel interval 13 has no filtering effect since there is no phase change material 121 in the pixel interval 13, so that the bright light may appear around the pixel units 12 and the light emitting from the pixel interval 13 cannot reflect the light of the color required by the solid-state total reflection display 1 as needed, which may cause the interference on the normal display of the solid-state total reflection display 1, reduce the contrast of the solid-state total reflection display 1 and then degrade the display effect.

Figure 2:
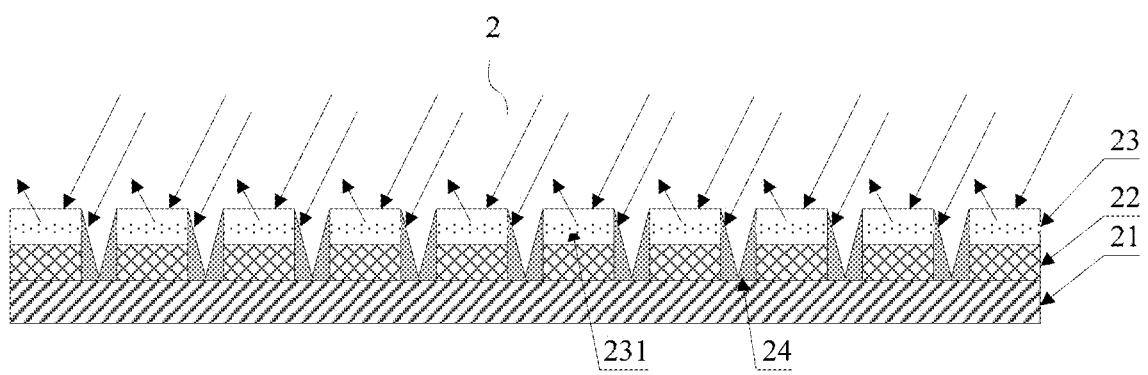
FIG. 2 is a first structural schematic diagram of a solid-state total reflection display according to an embodiment of the disclosure.
Figure 3:
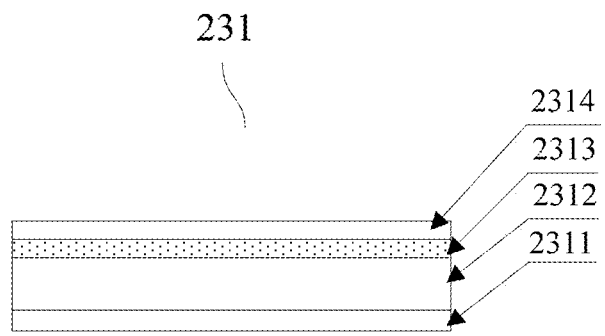
FIG. 3 is a structural schematic diagram of a pixel structure according to an embodiment of the disclosure.

In view of this, an embodiment of the present application provides a solid-state total reflection display, as shown in FIGS. 2 and 3.

FIG. 2 is a first structural schematic diagram of a solid-state total reflection display according to an embodiment of the disclosure, and FIG. 3 is a structural schematic diagram of a pixel structure according to an embodiment of the disclosure. The solid-state total reflection display 2 includes: a drive circuit layer 21, and a heating layer 22 and a pixel function layer 23 stacked successively on the drive circuit layer 21; a plurality of pixel structures 231 in the pixel function layer 23 being arranged in an array, and the pixel structure 231 including a reflection layer 2311, a resonant cavity layer 2312, a phase change material layer 2313 and a transparent covering layer 2314 stacked successively. After the external light is incident on the pixel structure 231 of the pixel function layer 23, the incident light produces colors by the resonant cavity layer 2312 in the pixel structure 231, and the phase change material layer 2313 modulates the colors to cause the light of particular wavelength (i.e., the light of particular color) to be reflected out, so that the user sees different colors.

Figure 4:
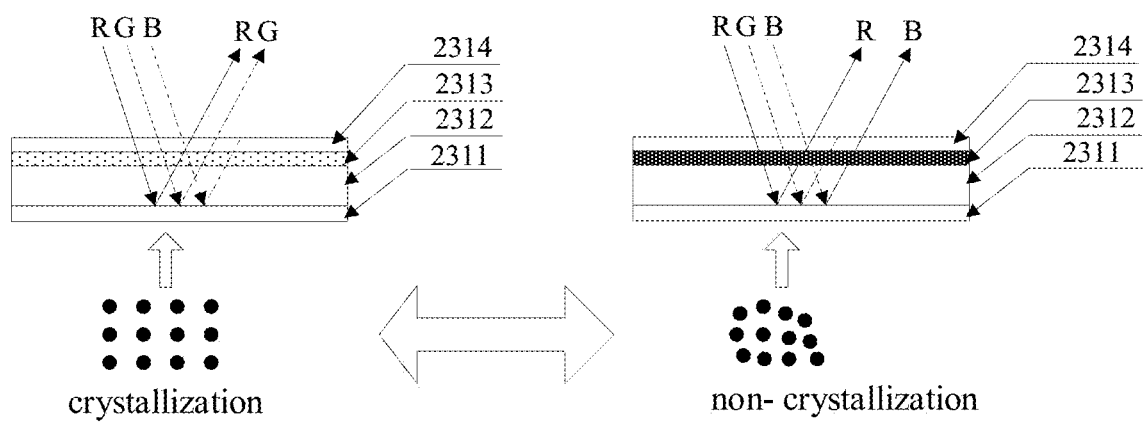
FIG. 4 is a schematic diagram of the color modulation performed by the phase change material layer on the reflected light according to an embodiment of the disclosure.

Referring to FIG. 4 which is a schematic diagram of the color modulation performed by the phase change material layer on the reflected light according to an embodiment of the disclosure, after the incident light (the white light is consisted of red R, green G and blue B lights) is incident on the pixel function layer 23, it is reflected via the reflection layer 2311 and divided into three colors R, G and B in the resonant cavity layer 2312. It is assumed that the light of wavelength corresponding to the color B is not allowed to emit when the molecular structure of the phase change material layer 2313 is crystallized, then the color of the emergent light at this time is yellow (assuming that the yellow is the mixed color of R and G). After the phase change material layer 2313 is heated via the heating layer for a certain amount of time, the molecular structure of the phase change material layer 2313 becomes non-crystallized. It is assumed that the light of wavelength corresponding to the color G is not allowed to emit under the non-crystallization, then the color of the emergent light at this time is purple (assuming that the purple is the mixed color of R and B). By heating the phase change material layer 2313, its molecular structure is transformed between the crystallization and the non-crystallization to change the color of the light emitting from the pixel function layer 23, so that the user sees that the solid-state total reflection display shows different colors.

A plurality of light adjusting structures 24 are arranged between two adjacent pixel structures 231 in the row or column direction of the array; and a side of each light adjusting structure 24 towards the ambient light-entering side of the solid-state total reflection display 2 is in a concave shape. In other words, the light adjusting structure 24 is a structure of which the edges are high and the center is low. The height direction here is the direction perpendicular to the plane in which the display is located. It can be understood that one light adjusting structure 24 in this embodiment corresponds to one complete and integrally-formed recess. The side of the light adjusting structure 24 back away from the light-emitting surface can be considered as a plane.

In an implementation provided by the disclosure, by arranging the light adjusting structure 24 between two adjacent pixel structures 231 and making a side of the light adjusting structure 24 towards the ambient light-entering side of the solid-state total reflection display 2 be in the concave shape, the reflection path of the part of the ambient light incident upon each light adjusting structure 24 can be changed, and the part of light cannot emit from the light adjusting structure 24 or emits outside the range of visibility of the user, to thereby reduce the light entering the human eyes, darken around the pixel structures 231 to increase the contrast of the solid-state total reflection display 2, and then increase the display effect of the solid-state total reflection display 2.

Figure 5:
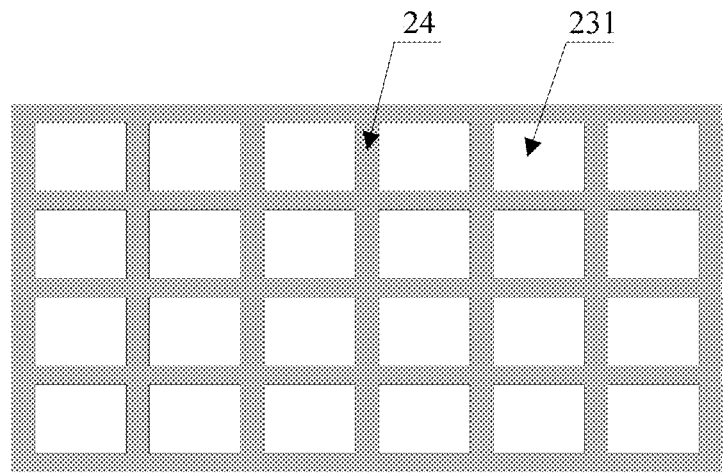
FIG. 5 is a schematic diagram of the orthographic projections of all the light adjusting structures in the solid-state total reflection display on the pixel function layer according to an embodiment of the disclosure.

Referring to FIG. 5, FIG. 5 is a schematic diagram of the orthographic projections of all the light adjusting structures in the solid-state total reflection display on the pixel function layer according to an embodiment of the disclosure. The pattern constituted of the orthographic projections of all the light adjusting structures 24 in the solid-state total reflection display 2 on the pixel function layer 23 is in a grid-like structure, where the meshes of grids each corresponds to a respective one of the pixel structures 231. The boundary of a single light adjusting structure 24 is not shown in FIG. 5.

In an embodiment of the disclosure, by arranging the pixel structure 231 in the mesh of each grid constituted by the light adjusting structures 24 in the pixel function layer 23, the periphery of the pixel structure 231 can darken via the light adjusting structures 24 to increase the contrast of the solid-state total reflection display 2, and then increase the display effect of the solid-state total reflection display 2.

Figure 6:
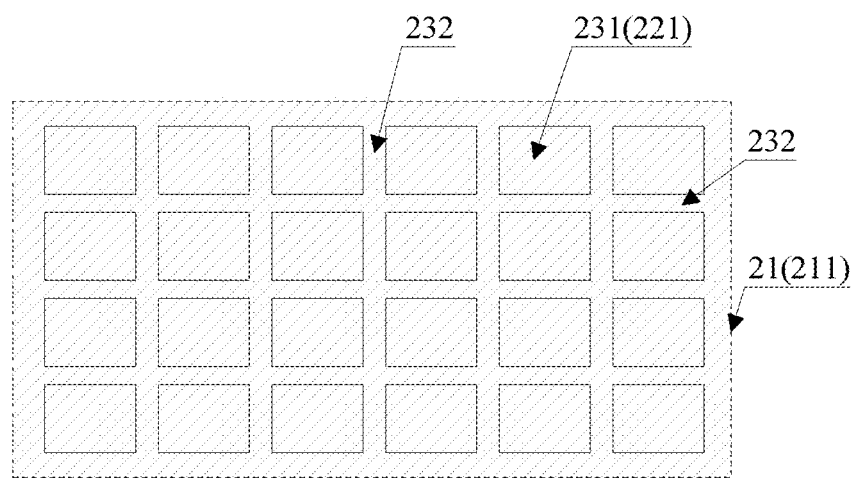
FIG. 6 is a schematic diagram of the orthographic projections of the heating elements in the heating layer, and the drive circuit layer on the pixel function layer according to an embodiment of the disclosure.

Referring to FIG. 6 which is a schematic diagram of the orthographic projections of the heating elements in the heating layer, and the drive circuit layer on the pixel function layer according to an embodiment of the disclosure, the drive circuit layer 21 includes a reflective metal layer 211, the orthographic projection of the reflective metal layer 211 on the pixel function layer 23 overlaps the intervals 232 each between two pixel structures 231, and the orthographic projection of the heating elements 221 in the heating layer 22 on the pixel function layer 23 does not overlap the intervals 232.

In FIG. 6, one heating element 221 (shown by the closed solid line area in FIG. 6) corresponds to one pixel structure 231 (shown by the closed solid line area in FIG. 6), the orthographic projection of the heating elements 221 on the pixel function layer 23 does not overlap the intervals 232 (shown by the area between the adjacent closed solid line areas in FIG. 6), and the orthographic projection of the reflective metal layer 211 (shown by the area covered with the oblique lines within the dotted line area in FIG. 6) of the drive circuit layer 21 (shown by the dotted line area in FIG. 6) on the pixel function layer 23 overlaps the intervals 232, to thereby avoid the heat generated by the heating elements 221 from affecting the drive circuit layer 21. Since the intervals 232 overlap the orthographic projection of the reflective metal layer 211 on the pixel function layer 23, the reflective metal layer 211 reflects the incident light incident upon the surface thereof. However the light adjusting structures 24 arranged in the intervals 232 can reduce the light entering the line of sight of the human eyes after reflected by the reflective metal layer 211, so that the periphery of the pixel structure 231 darkens to increase the contrast of the solid-state total reflection display, and then increase the display effect of the solid-state total reflection display.

It is necessary to note that, since the pixel function layer 23, the heating layer 22 and the drive circuit layer 21 are stacked together successively in the direction perpendicular to the solid-state total reflection display 2, in order to show the drive circuit layer 21 in FIG. 6, the heating elements 221 and the intervals 232 are semitransparent, so as to observe the orthographic projections of the drive circuit layer 21 and the reflective metal layer 211 on the pixel function layer.

Figure 7:
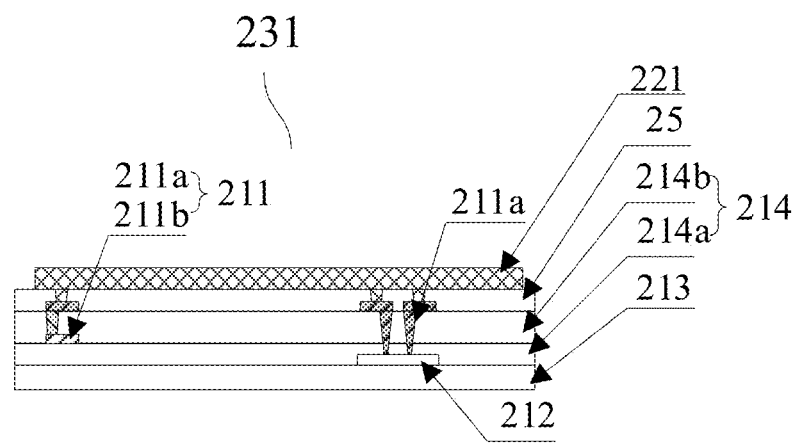
FIG. 7 is a structural schematic diagram of one pixel unit in the drive circuit layer according to an embodiment of the disclosure.
Figure 8:
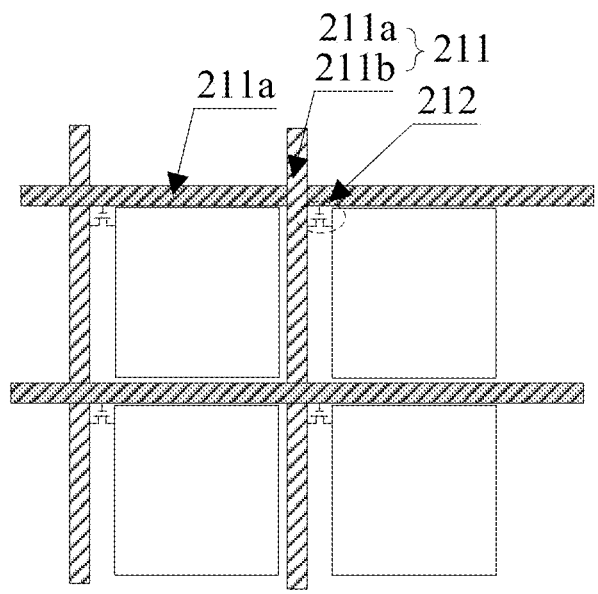
FIG. 8 is a top view of the drive circuit layer according to an embodiment of the disclosure.

Referring to FIGS. 7 and 8, FIG. 7 is a structural schematic diagram corresponding to one pixel unit in the drive circuit layer according to an embodiment of the disclosure, and FIG. 8 is a top view of the drive circuit layer according to an embodiment of the disclosure.

In FIG. 7, the drive circuit layer 21 includes: a base material layer 213, and a controller 212 arranged on the base material layer 213. An organic layer 214 is arranged on the base material layer 213 and the controller 212, and the organic layer 214 includes a first organic layer 214a and a second organic layer 214b stacked successively. The column electrodes 211b of the reflective metal layer 211 are arranged on the first organic layer 214a, and the row electrodes 211a of the reflective metal layer 211 are arranged on the second organic layer 214b. Referring to FIG. 8, the row electrodes 211a and the column electrodes 211b define a plurality of pixel units arranged in an array (shown by the white square area in FIG. 8). Continuing to refer to FIG. 7, the first insulating transparent layer 25 and the heating element 221 are stacked successively on the reflective metal layer 211, one pixel unit corresponds to the controller 212 and one heating element 221, the controller 212 is connected between the heating element 221 and the corresponding row electrode 211a, and the end of the heating element 221 far away from the controller 212 is electrically connected to the column electrode 211b. Whether the heating element 221 heats is controlled by turning on or off the controller 212.

The controller 212 can be a Thin Film Transistor (TFT) for example. When the controller 212 is a TFT, the gate of the TFT is connected to the row electrode 211a, the source of the TFT is connected to the column electrode 211b, and the drain of the TFT is connected to the heating element 221 corresponding to the pixel unit. When the TFT is in the on-state, the heating element 221 heats the pixel structure 231, and when the TFT is in the off-state, the heating element 221 stops heating the pixel structure 231.

It is necessary to note that the organic layer 214 is transparent and insulative, and the organic layer 214 can use the material which is same as or different from that of the first insulating transparent layer 25, which is not limited here. The introduction related to the first insulating transparent layer 25 will be provided below and thus omitted here.

Figure 9:
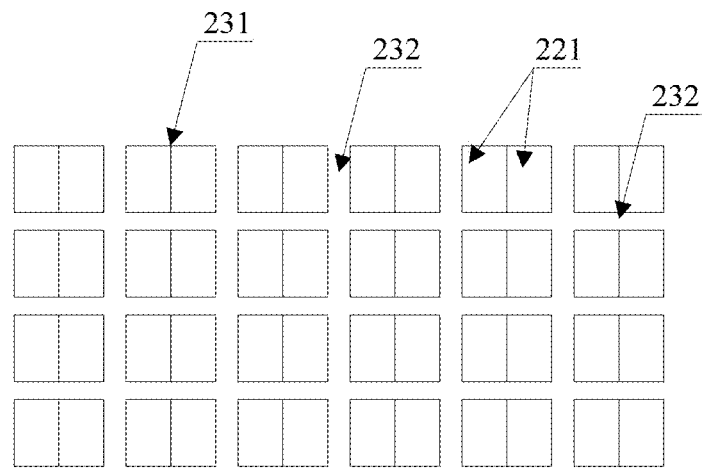
FIG. 9 is a schematic diagram of the orthographic projections of the heating elements in the heating layer on the pixel function layer according to an embodiment of the disclosure.

Referring to FIG. 9 which is a schematic diagram of the orthographic projection of the heating element in the heating layer on the pixel function layer according to an embodiment of the disclosure, one pixel structure 231 can also correspond to a plurality of heating elements 221. In one embodiment, it is possible that two heating elements 221 correspond to one pixel structure 231 as shown in FIG. 9, but of course, it is also possible that three, four or more heating elements 221 correspond to one pixel structure 231. The specific number of the heating elements 221 corresponding to one pixel structure 231 is not limited here, but none of the orthographic projections of these heating elements 221 on the pixel function layer 23 overlaps the interval 232 between two pixel structures 231. One pixel structure 231 corresponds to at least one heating element 221, which can increase the precision of the temperature control of the pixel structure 231 effectively.

Figure 10:
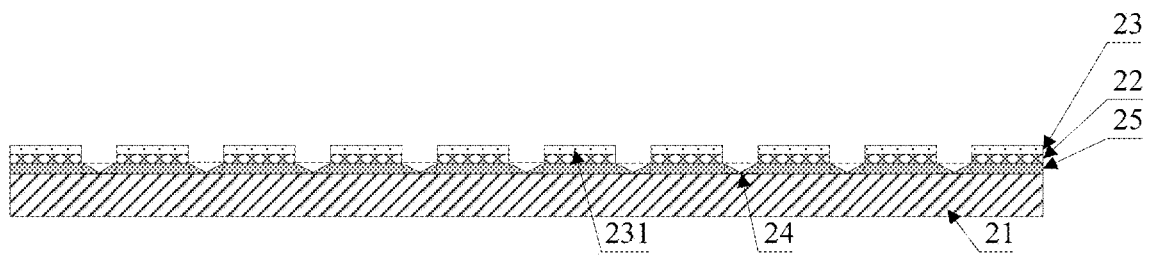
FIG. 10 is a second structural schematic diagram of a solid-state total reflection display provided by an embodiment of the disclosure.

Referring to FIG. 10 which is a second structural schematic diagram of a solid-state total reflection display according to an embodiment of the disclosure, the solid-state total reflection display 2 further includes a first insulating transparent layer 25 arranged between the drive circuit layer 21 and the heating layer 22, where the first insulating transparent layer 25 forms a plurality of light adjusting structures 24.

The first insulating transparent layer 25 is arranged between the drive circuit layer 21 and the heating layer 22, which, on the one hand, can prevent the short circuit between the drive circuit layer 21 and the heating layer 22 and have the insulation effect, and on the other hand, can prevent the heat produced in the heating layer 22 from transferring to the drive circuit layer 21 to affect the drive circuit layer 21. The specified technology (such as imprint technology, etching process or the like) is used in the insulating transparent layer 25, to form the light adjusting structures 24 (shown by the dotted line in FIG. 10).

Figure 11:
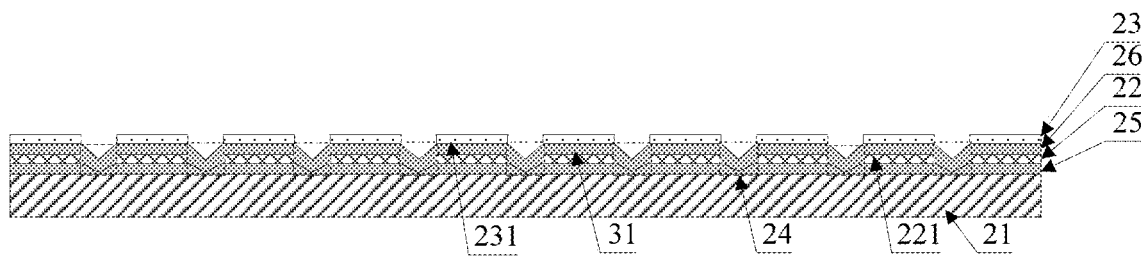
FIG. 11 is a third structural schematic diagram of a solid-state total reflection display provided by an embodiment of the disclosure.

Referring to FIG. 11 which is a third structural schematic diagram of a solid-state total reflection display according to an embodiment of the disclosure, the solid-state total reflection display further includes a second insulating transparent layer 26 arranged between the heating layer 22 and the pixel function layer 23 and covering the plurality of light adjusting structures 24 (shown by the gray area under the dotted line within the dashed box in FIG. 11) located in the first insulating transparent layer 25, wherein the part (shown by the gray area above the dotted line within the dashed box in FIG. 11) of the second insulating transparent layer 26 covering the light adjusting structures 24 depresses, along with the light adjusting structures 24, towards the direction of the drive circuit layer 21.

The second insulating transparent layer 26 can have the better heat conductivity, and can thus transfer the heat produced by the heating element 221 to the corresponding pixel structure 231 rapidly, and since the second insulating layer 26 is made of the insulating material, the part covering the light adjusting structures 24 can prevent the short circuit of the adjacent heating elements 221. Since a plurality of light adjusting structures 24 formed in the first insulating transparent layer 25 is in the concave shape, the part in the second insulating transparent layer 26 covering the light adjusting structures 24 depresses, along with the light adjusting structures 24, towards the direction of the drive circuit layer 21. Thus the concave shape of the light adjusting structures 24 may not change due to the addition of the second insulating transparent layer 26, so that the light adjusting structures 24 are constituted by both the first insulating transparent layer 25 and the second insulating transparent layer 26 to enable the light adjusting structures 24 to reduce the light entering the line of sight of the human eyes after reflected by the reflective metal layer 211, to thereby reduce the light brightness around the pixel structures 231, increase the contrast of the solid-state total reflection display 2, and then increase the display effect of the solid-state total reflection display 2.

In one embodiment, the ranges of the refractive indexes of the first insulating transparent layer 25 and the second insulating transparent layer 26 are 1.2~2.0.

The refractive indexes of the first insulating transparent layer 25 and the second insulating transparent layer 26 can be same or can be different, which is not limited specifically.

In an embodiment of the disclosure, by setting the refractive indexes of the first insulating transparent layer 25 and the second insulating transparent layer 26 to be 1.2~2.0, the ambient light entering the interval 232 can be refracted under the action of the light adjusting structures 24 into the light adjusting structures 24 rather than emitting from the light adjusting structures 24, to thereby reduce the light brightness around the pixel structures 231, increase the contrast of the solid-state total reflection display 2, and then increase the display effect of the solid-state total reflection display 2.

Figure 12:
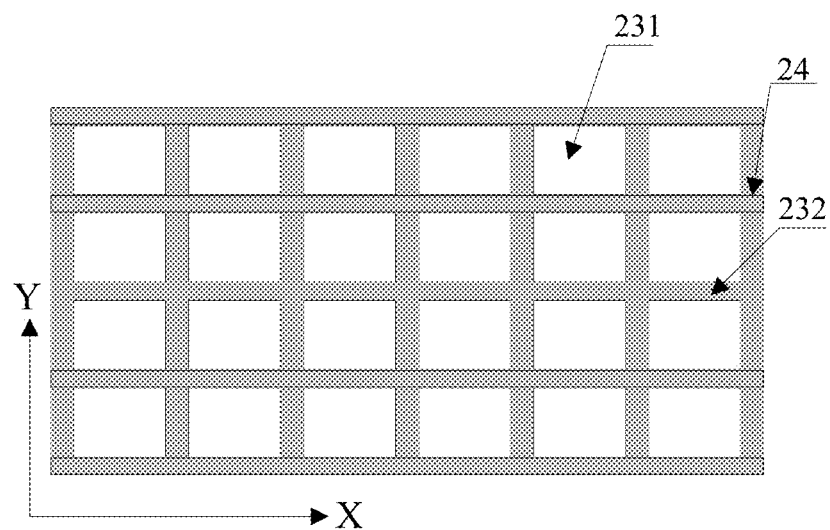
FIG. 12 is a first schematic diagram of the distribution of the orthographic projections of the light adjusting structures on the pixel function layer according to an embodiment of the disclosure.
Figure 13:
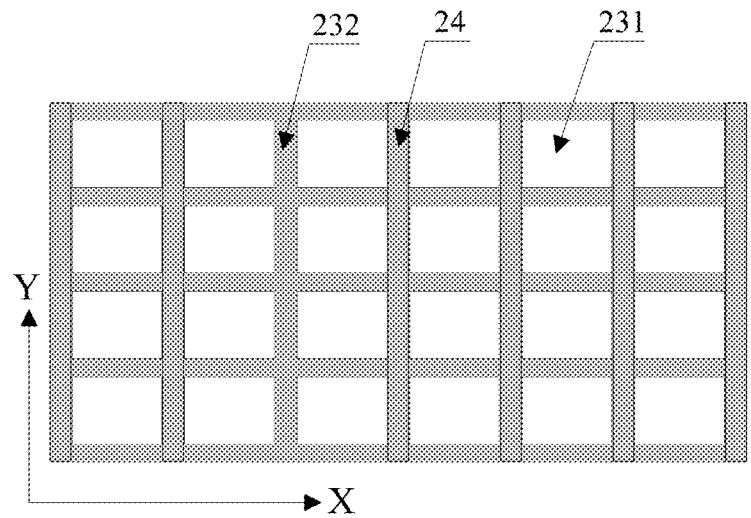
FIG. 13 is a second schematic diagram of the distribution of the orthographic projections of the light adjusting structures on the pixel function layer according to an embodiment of the disclosure.

Referring to FIGS. 12 and 13, FIG. 12 is a first schematic diagram of the distribution of the orthographic projections of the light adjusting structures in the pixel function layer according to an embodiment of the disclosure, and FIG. 13 is a second schematic diagram of the distribution of the orthographic projections of the light adjusting structures in the pixel function layer according to an embodiment of the disclosure. At least one light adjusting structure 24 is included in the interval 232 between the two adjacent pixel structures 231, and the light adjusting structure 24 is a strip-like notch extending in the first direction parallel to the extending direction of the interval 232.

Referring to FIG. 12, the intervals 232 formed by arranging the pixel structures 231 in an array are located between two adjacent rows of pixel structures 231 or two adjacent columns of pixel structures 231. The intervals 232 formed by the pixel array arrangement constituted of the pixel structures 231 are located in two adjacent pixel rows or two adjacent pixel columns. When the light adjusting structure 24 extends in the first direction which is X direction (e.g., row direction), the strip-like notch extending in the row direction (X direction) runs through a plurality of pixel columns; and when the light adjusting structure 24 extends in the first direction which is Y direction (e.g., column direction), the strip-like notch extending in the column direction (Y direction) runs through a plurality of pixel rows.

Figure 14:
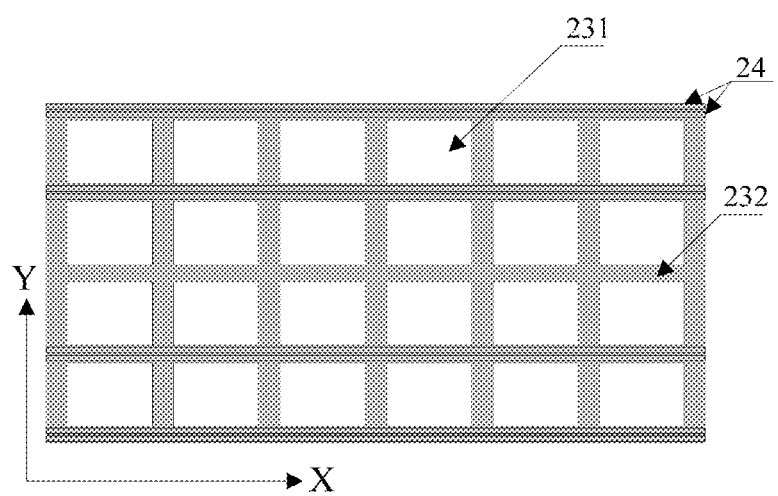
FIG. 14 is a third schematic diagram of the distribution of the orthographic projections of the light adjusting structures on the pixel function layer according to an embodiment of the disclosure.
Figure 15:
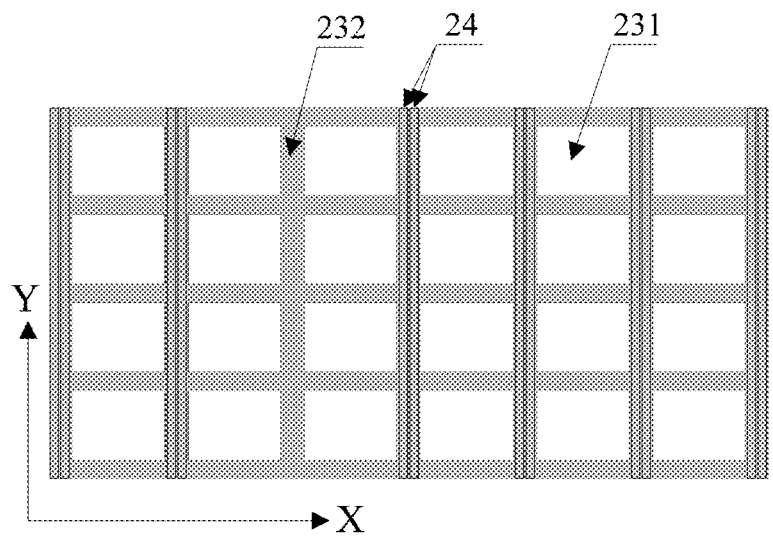
FIG. 15 is a fourth schematic diagram of the distribution of the orthographic projections of the light adjusting structures on the pixel function layer according to an embodiment of the disclosure.

Referring to FIGS. 14 and 15, FIG. 14 a third schematic diagram of the distribution of the orthographic projections of another kind of light adjusting structures in the pixel function layer according to an embodiment of the disclosure, and FIG. 15 is a fourth schematic diagram of the distribution of the orthographic projections of yet another kind of light adjusting structures in the pixel function layer according to an embodiment of the disclosure.

Here, the same description of the embodiment shown in FIG. 14 as that in FIG. 12 is omitted here, and the same description of the embodiment shown in FIG. 15 as that in FIG. 13 is also omitted here.

The difference is as follows: when there are at least two light adjusting structures 24 in the interval 232, the at least two light adjusting structures 24 are arranged side by side in the interval 232 in the direction perpendicular to the extending direction of the light adjusting structures 24.

It is necessary to note that as shown in FIGS. 12 and 13 are the diagrams in which one light adjusting structure is included in the interval 232, and as shown in FIG. 14 is the diagram in which two light adjusting structures 24 are included in the interval 232. In the practical application, three or even more light adjusting structures 24 can also be included in each interval 232, and the specific number is not limited here. And the light adjusting structures 24 may be arranged in all the intervals 232 (including the intervals extending in the X and Y directions). Merely in order to be convenient to understand, FIGS. 12 and 15 show the light adjusting structures 24 only in the intervals 232 extending in the X or Y direction, and in order to distinguish the intervals 232 from the light adjusting structures 24, the corresponding light adjusting structures 24 are not shown in the positions labelling the intervals 232, which cannot be understood that there is no light adjusting structure 24 in the intervals 232 not showing the light adjusting structures 24.

Figure 16:
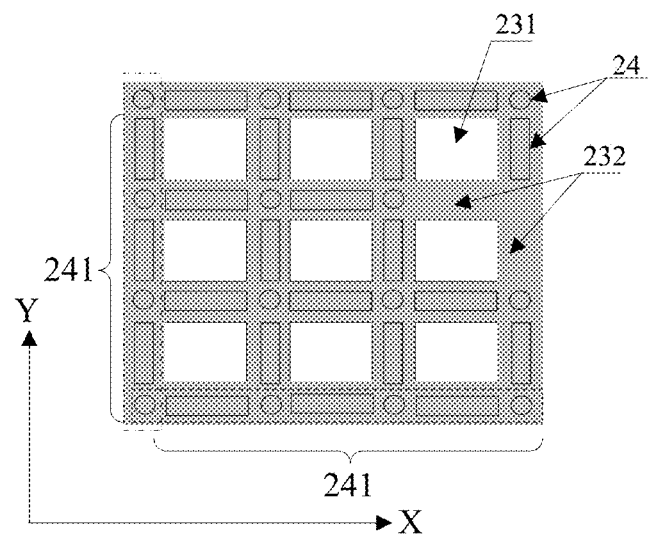
FIG. 16 is a fifth schematic diagram of the distribution of the orthographic projections of the light adjusting structures on the pixel function layer according to an embodiment of the disclosure.

Referring to FIG. 16 which is a fifth schematic diagram of the distribution of the orthographic projections of the light adjusting structures in the pixel function layer according to an embodiment of the disclosure, at least one light adjusting structure group 241 is included in the interval 232 between two adjacent pixel structures 231, and the light adjusting structure group 241 includes a plurality of light adjusting structures 24 arranged in the first direction parallel to the extending direction of the interval 232 where the light adjusting structure group 241 is located.

In FIG. 16, one light adjusting structure group 241 (shown by a plurality of light adjusting structures in the dashed area) is included in one interval 232 extending in the X direction, and the light adjusting structure group 241 includes 7 light adjusting structures 24 (consisted of 3 strip-like notches and 4 concave spots); and one light adjusting structure group 241 (shown by a plurality of light adjusting structures in the double-dot line area) is included in one interval 232 extending in the Y direction, and the light adjusting structure group 241 includes 7 light adjusting structures 24 (consisted of 3 strip-like notches and 4 concave spots).

In an embodiment of the disclosure, the notch or concave spot is limited to its corresponding process size, so at least one light adjusting structure group 241 is arranged in the interval 232, where the light adjusting structure group 241 includes a plurality of light adjusting structures 24 arranged in the first direction parallel to the extending direction of the interval 232 where the light adjusting structure group 241 is located, which can bestrew the light adjusting structures 24 in the interval 232, so that the light transmission path of almost all light entering the interval 232 is changed by the light adjusting structures 24 and almost all light entering the interval 232 cannot enter the field of view of the user, to thereby reduce the light brightness around the pixel structures 231, increase the contrast of the solid-state total reflection display 2, and then increase the display effect of the solid-state total reflection display 2. And a plurality of notches are arranged side by side, which can avoid the too deep notch while meeting the slope of the side wall of the notch; and meanwhile, which further can increase the uniformity of the film layer, thereby avoiding the too much lack of the partial film layer to cause the stress concentration problem.

Figure 17:
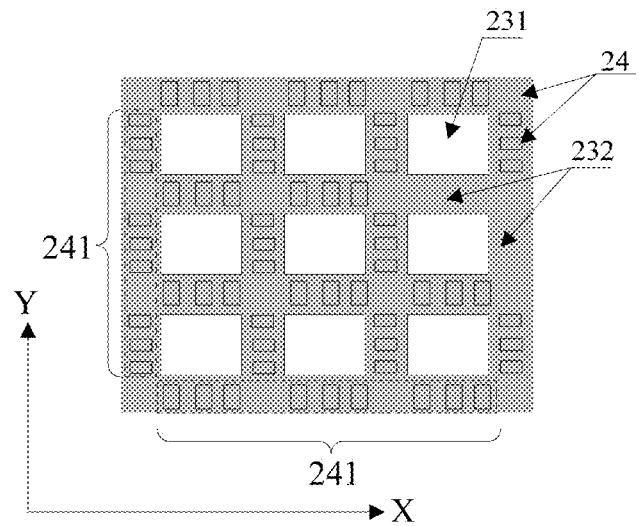
FIG. 17 is a distribution schematic diagram where the light adjusting structures are all the notches according to an embodiment of the disclosure.
Figure 18:
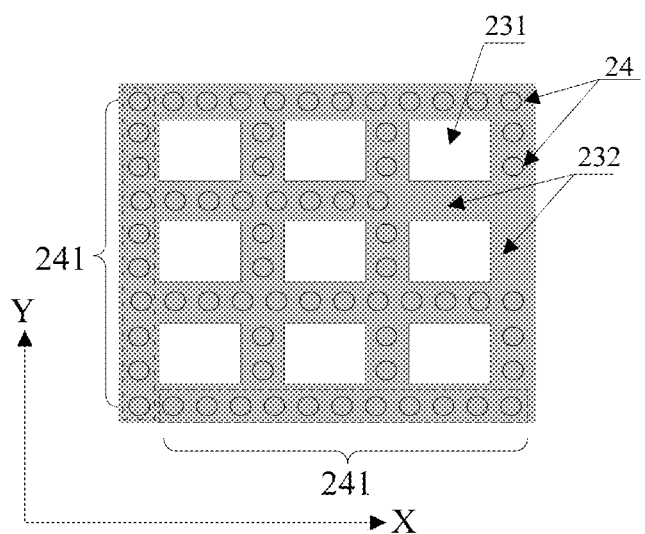
FIG. 18 is a distribution schematic diagram where the light adjusting structures are all the concave spots according to an embodiment of the disclosure.

In one embodiment, the plurality of light adjusting structures in the light adjusting structure group 241 are all concave spots or strip-like notches. Referring to FIGS. 17 and 18, FIG. 17 is a distribution schematic diagram where the light adjusting structures are all the notches according to an embodiment of the disclosure, and FIG. 18 is a distribution schematic diagram where the light adjusting structures are all the concave spots according to an embodiment of the disclosure, where the concave spots are shown by the circles in FIG. 18; or the plurality of light adjusting structures 24 in the light adjusting structure group 241 include the notches and the concave spots respectively. Referring to FIG. 16, the concave spots are shown by the circles in FIG. 16.

In an embodiment of the disclosure, the plurality of light adjusting structures in the light adjusting structure group 241 are all set as the concave spots or strip-like notches, which can be implemented by one process, to thereby reduce the process complexity and increase the production efficiency.

In one embodiment, when the plurality of light adjusting structures 24 in the light adjusting structure group 241 include the notches and the concave spots respectively, the notches and the concave spots are arranged alternately in the first direction parallel to the extending direction of the interval, as shown in FIG. 16.

In an embodiment of the disclosure, when the plurality of light adjusting structures 24 in the light adjusting structure group 241 include the notches and the concave spots respectively, the notches and the concave spots are arranged alternately in the first direction, which can effectively utilize different opening sizes of the notches and the concave spots to cause the interval 232 to be maximally bestrewed by the notches and the concave spots, so that the light transmission path of all the light entering the interval 232 is adequately changed by the light adjusting structures 24 consisted of the notches and the concave spots and the light entering the interval 232 cannot enter the field of view of the user, to thereby reduce the light brightness around the pixel structures 231, increase the contrast of the solid-state total reflection display 2, and then increase the display effect of the solid-state total reflection display 2.

In one embodiment, when the plurality of light adjusting structures 24 in the light adjusting structure group 241 are all the notches, the plurality of light adjusting structures 24 are arranged in the first direction and the notches extend in the second direction perpendicular to the first direction.

Referring to FIG. 17, when the interval 232 extends in the X direction, a plurality of light adjusting structures 24 are arranged in the first direction (i.e., X direction), and when the plurality of light adjusting structures 24 are all the notches, the notches extend in the second direction (i.e., Y direction) perpendicular to the first direction; when the interval 232 extends in the Y direction, a plurality of light adjusting structures 24 are arranged in the first direction (i.e., Y direction), and when the plurality of light adjusting structures 24 are all the notches, the notches extend in the second direction (i.e., X direction) perpendicular to the first direction.

In an embodiment of the disclosure, when the plurality of light adjusting structures 24 in the light adjusting structure group 241 are all the notches, the plurality of light adjusting structures 24 are arranged in the first direction and the notches extend in the second direction perpendicular to the first direction, so that the transmission path of the light entering the interval 232 can be adequately changed by the notches and the light entering the interval 232 cannot enter the field of view of the user, to thereby reduce the light brightness around the pixel structures 231, increase the contrast of the solid-state total reflection display 2, and then increase the display effect of the solid-state total reflection display 2.

Figure 19:
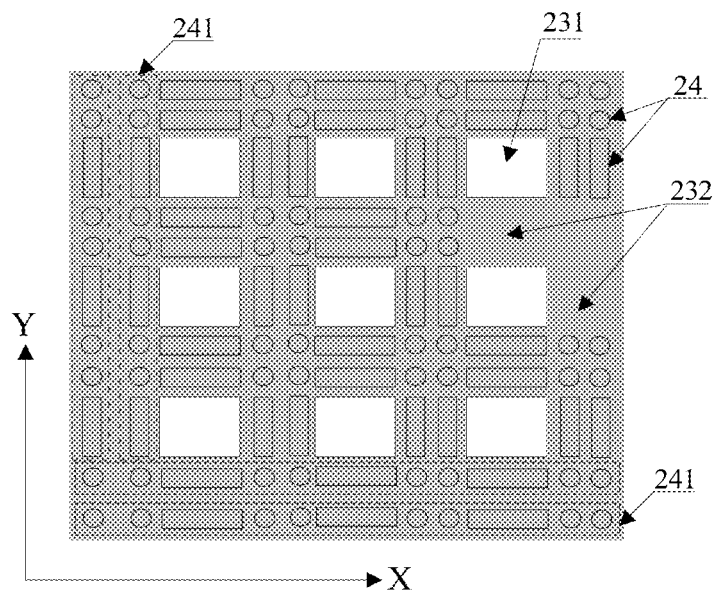
FIG. 19 is a first schematic diagram of the distribution of the orthographic projections of the light adjusting structure groups on the pixel function layer according to an embodiment of the disclosure.

Referring to FIG. 19, which is a first schematic diagram of the distribution of the orthographic projections of the light adjusting structure group in the pixel function layer according to an embodiment of the disclosure, a plurality of light adjusting structure groups 241 are included in the interval 232 between two adjacent pixel structures 231, and the light adjusting structure groups 241 in the same interval 232 are arranged in the third direction.

In FIG. 19, two light adjusting structure groups 241 (shown by a plurality of light adjusting structures in the dashed area) are included in an interval 232 extending in the X direction, and the two light adjusting structure groups 241 in the same interval 232 are arranged in the third direction (e.g., Y direction); and two light adjusting structure groups 241 (shown by a plurality of light adjusting structures in the double-dot line area) are included in an interval 232 extending in the Y direction, and the two light adjusting structure groups 241 in the same interval 232 are arranged in the third direction (e.g., X direction).

In an embodiment of the disclosure, when the width of the interval 232 is wider and the size of the light adjusting structures is smaller, the light adjusting structures 24 will not bestrew the interval 232. At this time, by arranging a plurality of light adjusting structure groups 241 arranged in the third direction in the same interval 232, the light adjusting structures 24 can bestrew the interval 232, so that the light transmission path of all the light entering the interval 232 is adequately changed by the light adjusting structures 24 and the light entering the interval 232 cannot enter the field of view of the user, to thereby reduce the light brightness around the pixel structures 231, increase the contrast of the solid-state total reflection display 2, and then increase the display effect of the solid-state total reflection display 2.

In one embodiment, at least one light adjusting structure 24 in the plurality of light adjusting structure groups 241 is the strip-like notch; where the notch extends in the first direction parallel to the extending direction of the interval 232 or extends in the third direction intersecting with the first direction.

Figure 20:
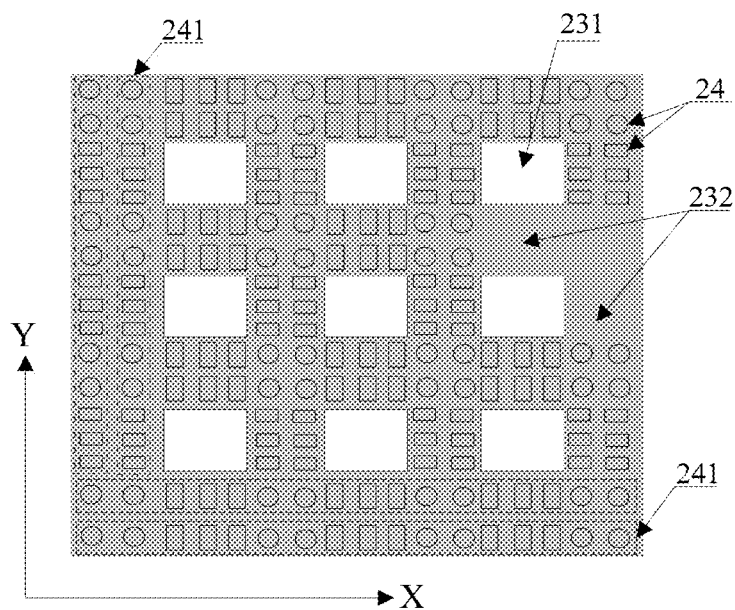
FIG. 20 is a schematic diagram of the extending direction of the notches in the light adjusting structure groups according to an embodiment of the disclosure.

Referring to FIGS. 19 and 20, FIG. 20 is a schematic diagram of the extending direction of the notches in the light adjusting structure group according to an embodiment of the disclosure. When at least one light adjusting structure 24 in the plurality of light adjusting structure groups 241 is the strip-like notch, the notches in the interval 232 extending in the X direction can extend in the first direction (X direction) (referring to FIG. 19), or can extend in the third direction (Y direction) (referring to FIG. 20).

It is necessary to note that a plurality of adjacent concave spots in the plurality of light adjusting structure groups 241 in the same interval 232 in FIGS. 19 and 20 can be replaced by one larger concave spot in order to reduce the process difficulty in the practical application.

In an embodiment of the disclosure, at least one light adjusting structure 24 in the plurality of light adjusting structure groups 241 is the strip-like notch, and more strip-like notches can be arranged in the interval 232 by extending the notches in the first direction parallel to the extending direction of the interval 232 or in the third direction intersecting with the first direction, so that the transmission path of most of the light entering the interval 232 is changed by the notches and the light entering the interval 232 cannot enter the field of view of the user, to thereby reduce the light brightness around the pixel structures 231, increase the contrast of the solid-state total reflection display 2, and then increase the display effect of the solid-state total reflection display 2.

It is necessary to note that all the light adjusting structures in the above-mentioned light adjusting structure group 241 can also be the notches or concave spots. When they are all the notches, the extending direction of the notches can refer to FIG. 17, and the detailed description thereof will be omitted here. FIG. 19 only show the case that two light adjusting structure groups 241 are arranged in the same interval. In the practical application, more light adjusting structure groups 241 can be arranged in the same interval 232, and individual light adjusting structures 24 in the light adjusting structure groups 241 can be same or different. When they are different, they can be combined in any way, such as by alternately arranging the notches and concave spots, and two or more concave spots are arranged between two notches, which is not limited specifically.

Figure 21:
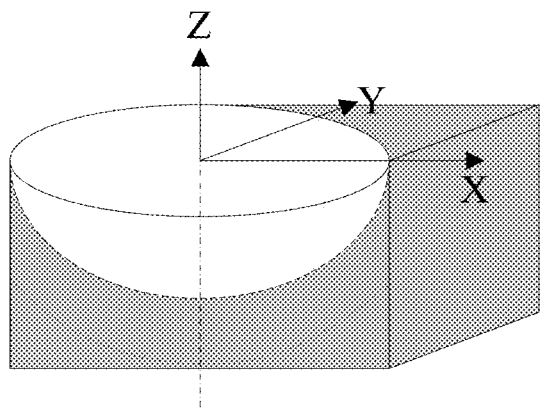
FIG. 21 is a three-dimension schematic diagram when the light adjusting structure is the concave spot according to an embodiment of the disclosure.

Referring to FIG. 21 which is a three-dimension schematic diagram when the light adjusting structure is the concave spot according to an embodiment of the disclosure, when the light adjusting structure 24 is the concave spot, the concave space of the concave spot is in a rotator shape (shown by the dotted line in FIG. 21), and the center axis Z of the rotator is perpendicular to the plane (i.e., XY plane) in which the pixel function layer is located.

In an embodiment of the disclosure, when the light adjusting structure 24 is the concave spot, the process difficulty of fabricating the concave spot can be reduced effectively to increase the production efficiency by setting the concave space of the concave spot to be in the rotator shape and making the center axis Z of the rotator be perpendicular to the plane in which the pixel function layer is located.

Referring to FIGS. 16 and 19, when the plurality of light adjusting structures 24 in the light adjusting structure group 241 include the notches and the concave spots respectively, the concave spots are arranged at the positions where the intervals extending in the first direction (X direction) intersect with the intervals extending in the fourth direction (Y direction) unparallel to the first direction.

Figure 22:
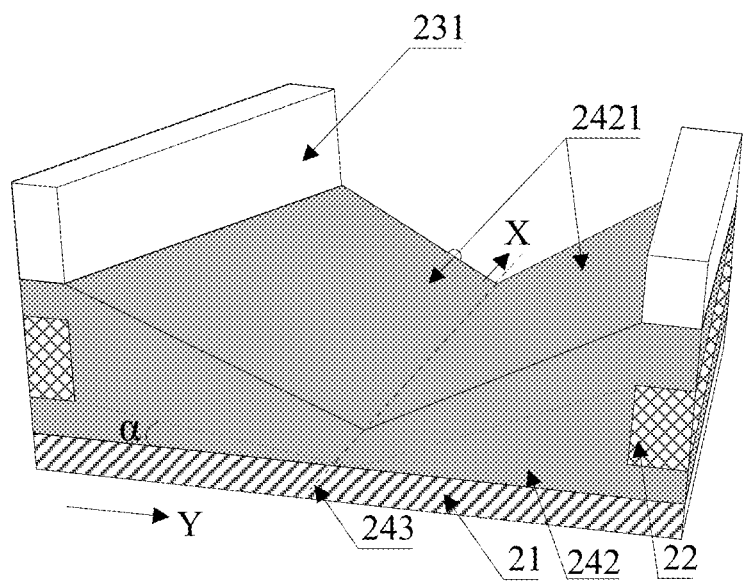
FIG. 22 is a first three-dimension schematic diagram when the light adjusting structure is the notch according to an embodiment of the disclosure.

Referring to FIG. 22 which is a first three-dimension schematic diagram when the light adjusting structure is the notch according to an embodiment of the disclosure, the notch includes the opposite side walls 242 which are symmetric about the center axis 243 of the notch, the center axis 243 is parallel to the first direction. In one embodiment, the first direction is the extending direction of the interval 232 where the notch is located.

In an embodiment of the disclosure, the process difficulty of fabricating the notch can be reduced effectively by setting the opposite side walls 242 of the notch to be symmetric about the center axis 243 of the notch and making the center axis 243 be parallel to the first direction. In one embodiment, the imprint technology can be used to directly form the notch.

Figure 23:
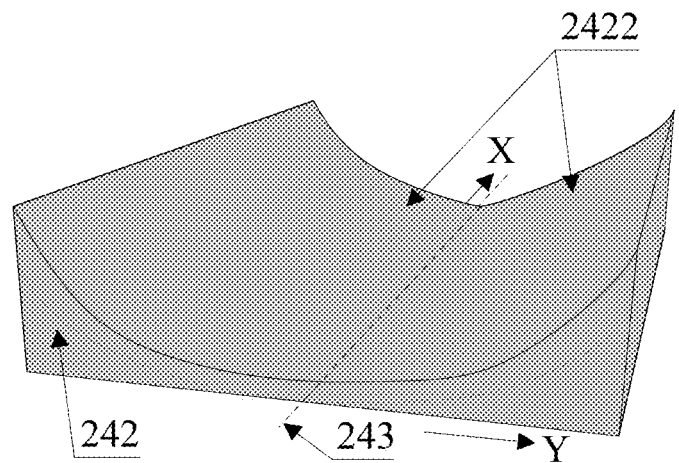
FIG. 23 is a second three-dimension schematic diagram when the light adjusting structure is the notch according to an embodiment of the disclosure.

Referring to FIGS. 22 and 23, the light adjusting structure 24 is the strip-like notch including the opposite side walls 242 which are the camber surfaces 2422 or inclined surfaces 2421.

Referring to FIG. 23 which is a second three-dimension schematic diagram when the light adjusting structure is the notch according to an embodiment of the disclosure, the side walls 242 in FIG. 23 are the camber surfaces 2422, and the camber surfaces 2422 of two side walls 242 of the notch can be symmetric about the center axis 243, or can be asymmetric, for example, two camber surfaces 2422 can have different curved radii.

Continuing to refer to FIG. 22, the side walls 242 are the inclined surfaces 2421, and the inclined surfaces 2421 of two side walls 242 of the notch can be symmetric about the center axis 243, or can be asymmetric, for example, two inclined surfaces 2421 can have different slopes.

Continuing to refer to FIG. 22, in the direction of the inclined surface (i.e., side wall 242) close to the pixel structures 231, the included angle α between the inclined surface 2421 and the plane (XY plane) in which the drive circuit layer 21 is located has the value range of $\theta \leq \alpha < 90°$, where θ is the critical angle at which the light in the light adjusting structure 24 is totally reflected on the inclined surface 2421.

Figure 24:
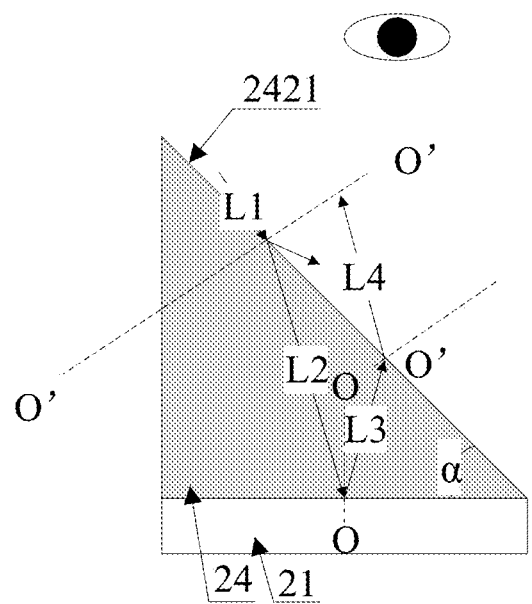
FIG. 24 is a first schematic diagram where the incident light reflects on an inclined surface of the light adjusting structure according to an embodiment of the disclosure.

Referring to FIG. 24 which is a schematic diagram where the incident light reflects on an inclined surface of the light adjusting structure according to an embodiment of the disclosure, OO is the normal line perpendicular to the plane in which the drive circuit layer 21 is located, and O'O' is the normal line perpendicular to the inclined surface 2421.

When the incident light L1 in the air reaches the inclined surface of the light adjusting structure 24, it may be reflected and refracted on the inclined surface 2421 of the light adjusting structure 24. Since the light adjusting structure 24 is made of the transparent material, the proportion of the energy of the partial light reflected to the energy of the incident light L1 is too low and can be negligible, while the refracted light L2, of which the energy proportion to the incident light L1 is relatively high, enters the inside of the light adjusting structure 24.

When reaching the interface of the bottom of the light adjusting structure 24 and the drive circuit layer 21, the refracted light L2 will be refracted (since the drive circuit layer 21 is made of the non-transparent material, the energy proportion of the reflected light L3 to the refracted light L2 is relatively high, and thus only the reflected light L3 is considered). When the reflected light L3 is reflected to the inclined surface 2421 of the light adjusting structure 24, it is assumed that the corresponding emergent light L4 produced by the refraction of the reflected light L3 on the inclined surface 2421 enters the air.

If the emergent light L4 is in the range of visibility of the human eyes, the light adjusting structure 24 observed by the user is in the bright state; if it is reversely concluded according to the uniqueness of the light path that the incident light L1 corresponding to the produced emergent light L4 cannot be found outside the light adjusting structure 24, it is demonstrated that the emergent light L4 does not exist or the emergent light L4 exists but is outside the range of visibility of the human eyes, and thus the light adjusting structure 24 observed by the user is in the dark state. The emergent range of the emergent light L4 will be introduced below under the different value ranges of α.

Before the introduction, the condition of the total reflection is illustrated. The occurrence of the total reflection of the light needs to meet two conditions simultaneously: (1) the light enters the optically thinner medium from the optically denser medium, (2) the angle of incidence of the light is greater than or equal to the critical angle of the total reflection.

It should be understood that the incident light L1 enters the light adjusting structure 24 from the air and the refractive index n1 is less than the refractive index n2 of the light adjusting structure 24, that is, the incident light L1 enters the optically denser medium from the optically thinner medium, so the incident light L1 may not be totally reflected on the inclined surface 2421 of the light adjusting structure 24, and thus the case of the total reflection of L1 is not discussed.

L1 is refracted on the inclined surface 2421 to produce the refracted light L2. When the reflected light L3 produced after the refracted light L2 is reflected by the drive circuit layer 21 reaches the inclined surface 2421, the reflected light L3 emits towards the optically thinner medium (air) from the optically denser medium (light adjusting structure 24), so the reflected light L3 may be totally reflected or may be refracted on the inclined surface 2421. Here, the total reflection of L3 has the critical angle of $\theta = \arcsin(n1/n2)$.

In order to facilitate the subsequent introduction, the several important marks in the above-mentioned lights are now be illustrated. It is assumed that the included angle of the normal line (denoted as O'O') perpendicular to the inclined surface 2421 and L2 is $\beta_2$ (i.e., angle of refraction of L2), the included angle of the normal line (denoted as OO) perpendicular to the bottom surface (i.e., the interface of the drive circuit layer 21 and the light adjusting structure 24) and L2 is $\beta'_2$ (i.e., the angle of incidence of L2 on the bottom surface), and the corresponding angle of reflection of L2 is denoted as $\beta'_3 = \beta'_2$. When the reflected light L3 formed by L2 passing through the drive circuit layer 21 is incident to the inclined surface 2421, the included angle of the reflected light L3 and the normal line O'O' is denoted as $\beta_3$ (i.e., the angle of incidence of L3 on the inclined surface). It can be seen from the geometric calculation that the included angle (acute angle) between the normal lines O'O' and OO is α.

In the first case, when α≥θ, the emergent light L4 may emit above the normal line O'O' (i.e., from the side far away from the bottom surface of the light adjusting structure 24), or may emit under the normal line O'O' (i.e., from the side close to the bottom surface of the light adjusting structure 24). If the emergent light L4 exists, it is demonstrated that the L3 may be refracted on the inclined surface 2421. At this time, the value range of the angle of incidence of L3 must meet: $0<\beta_3<\theta$ (if $\beta_3 \geq \theta$, it is demonstrated that the total reflection occurs and the emergent light L4 does not exist).

Figure 25:
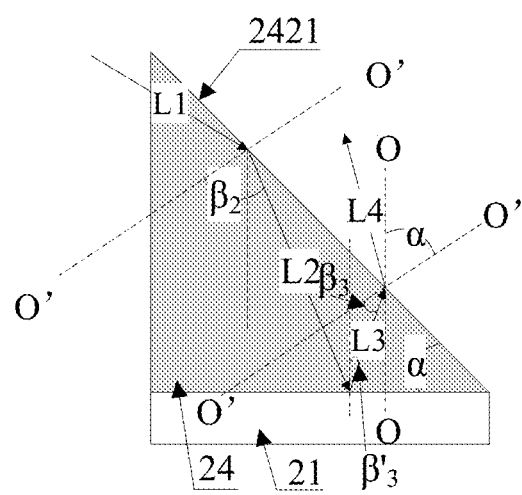
FIG. 25 is a first schematic diagram of the light path when the emergent light L4 emits from the inclined surface above the normal line O'O' according to an embodiment of the disclosure.

Referring to FIG. 25, FIG. 25 is a first schematic diagram of the light path when the emergent light L4 emits from the inclined surface above the normal line O'O' according to an embodiment of the disclosure.

Due to the angle of incidence $\beta_3<\theta$ of the incident light L3 of the emergent light L4 and α≥θ in the first case, $\beta_3<\alpha$, while the included angle between the normal lines O'O' and OO is also α, so it is demonstrated that the direction of L3 is between the normal lines O'O' and OO (as shown in FIG. 25).

Also since L3 is obtained by reflecting L2 on the bottom surface, $\alpha=\beta_3+\beta'_3$ and $\beta_3=\alpha+\beta'_3$ can be calculated by the geometric calculation, and then $\beta_2=2\alpha-\beta_3$ is calculated. $0<\beta_3<\theta$, so $\alpha<\beta_2<2\alpha$. However, in the first case, α≥0, so $\beta_2>\theta$, which demonstrates that L2 is obtained by totally reflecting the other light inside the light adjusting structure 24 on the inclined surface 2421, that is, the incident light L1 does not exist.

Therefore, when α≥θ, the emergent light L4 will emit above the normal line O'O', and the incident light L1 can only exists inside the light adjusting structure, so that it is proved by contradiction that all the light incident on the inclined surface is impossible to emit above the normal line O'O'.

Figure 26:
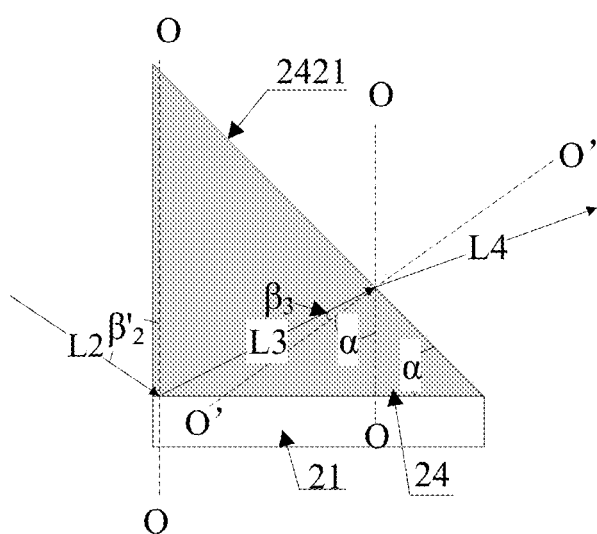
FIG. 26 is a first schematic diagram of the light path when the emergent light L4 emits from the inclined surface under the normal line O'O' according to an embodiment of the disclosure.

Referring to FIG. 26, FIG. 26 is a first schematic diagram of the light path when the emergent light L4 emits from the inclined surface under the normal line O'O' according to an embodiment of the disclosure.

The angle of reflection of the light L3 on the bottom surface can be calculated as $\beta'_3=\beta_3+\alpha$, and according to the law of reflection, the angle of incidence of the light L2 on the bottom surface is $\beta'_2=\beta'_3=\beta_3+\alpha$, which demonstrates $\beta'_2>\alpha$ and thus demonstrates that L2 does not intersect with the inclined surface 2421, that is, L2 is actually the incident light, but L2 cannot be obtained from the light incident on the inclined surface 2421 (that is, the incident light L1 does not exist), so the emergent light L4 does not exist.

Therefore, when α≥θ, the emergent light L4 will emit under the normal line O'O', and the incident light L1 does not exist, so that it is proved by contradiction that all the light incident on the inclined surface is impossible to emit under the normal line O'O'.

To sum up, in the first case of α≥θ, the incident light incident to the inclined surface 2421 from the air cannot emit from the inclined surface 2421 after entering the light adjusting structures 24, so that the area where the light adjusting structures are located and which is observed by the human eyes is in the dark state. Since the light adjusting structures 24 are located in the intervals of the pixel structures 231, the pixel structures 231 are in the dark state.

In the second case, when α<θ, the emergent light L4 may emit above the normal line O'O' (i.e., from the side far away from the bottom surface of the light adjusting structure 24), or may emit under the normal line O'O' (i.e., from the side close to the bottom surface of the light adjusting structure 24). If the emergent light L4 exists, it is demonstrated that the L3 may be refracted on the inclined surface 2421. At this time, the value range of the angle of incidence of L3 must meet: $0<\beta_3<\theta$ (if $\beta_3 \geq \theta$, it is demonstrated that the total reflection occurs and the emergent light L4 does not exist).

Figure 27:
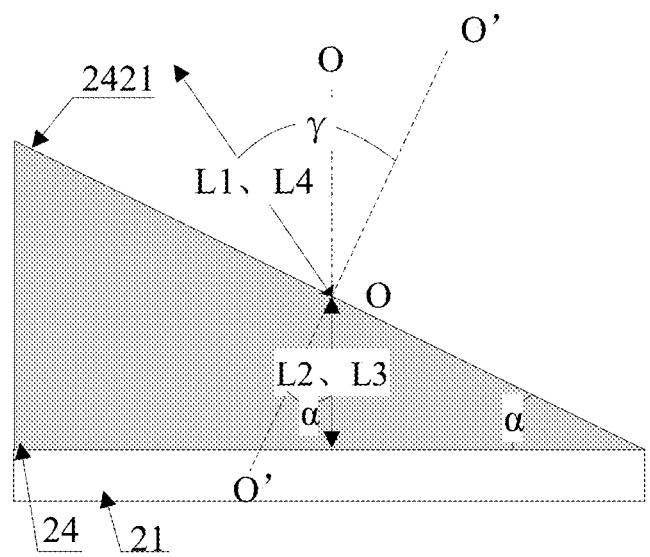
FIG. 27 is a second schematic diagram of the light path when the emergent light L4 emits from the inclined surface above the normal line O'O' according to an embodiment of the disclosure.

1. Referring to FIG. 27, FIG. 27 is a second schematic diagram of the light path when the emergent light L4 emits from the inclined surface above the normal line O'O' according to an embodiment of the disclosure.

Assuming that the incident light L1 is incident on the inclined surface 2421 at the angle of incidence γ relative to the normal line O'O' and the included angle of the refracted light L2 and the normal line OO is 0, then the angle of refraction of L2 is $\beta_2=\alpha$. In the second case, α<0, so $\beta_2<0$, which demonstrates that L2 may be obtained by refracting L1, and thus the emergent light L4 exists when L1 is incident at the angle of incidence γ.

At this time, L2 overlaps L3 obtained by reflecting L2 on the bottom surface, and then the emergent light L4 produced by refracting L3 on the interface between the inclined surface 2421 and the air overlaps the incident light L1.

When the included angle of the emergent light L4 and the normal line O'O' (i.e., the angle of emergence of L4, denoted as (34) is greater than γ, L3 is located at the right of the vertical line, and when the included angle of the emergent light L4 and the normal line O'O' is less than γ, L3 is located at the left of the vertical line.

1) For the angle of emergence of the emergent light L4 greater than γ, L3 is located at the right of the vertical line.

Figure 28:
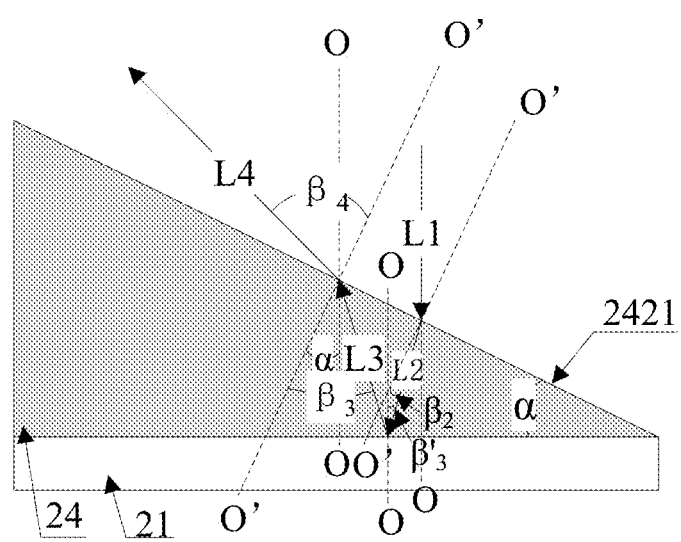
FIG. 28 is a schematic diagram of the light path when the emergence angle of the emergent light L4 is greater than γ according to an embodiment of the disclosure.

Referring to FIG. 28, FIG. 28 is a schematic diagram of the light path when the emergence angle of the emergent light L4 is greater than γ according to an embodiment of the disclosure.

$\alpha=\beta_3+\beta'_3$ can be obtained by the geometric calculation, to produce the angle of refraction $\beta_2=\alpha+\beta'_3$ of L2 on the inclined surface 2421, and then $\beta_2=2\alpha-\beta_3$ can be calculated.

Due to $\beta_4>\gamma$ and accordingly $\beta_3>\alpha$ and also due to $0<\beta_3<\theta$, $\alpha<\beta_3<\theta$. In the second case, α<θ, and then $2\alpha-\theta<\beta_2<\theta$ can be calculated, which demonstrates that L1 producing L2 exists at this time.

That is, when L4 emits at the angle great than or equal to γ above the normal line O'O', the incident light L1 incident to the light adjusting structures 24 from the air exists, and it is in the bright state at this time.

2) For the angle of emergence of the emergent light L4 less than γ, L3 is located at the left of the vertical line.

Figure 29:
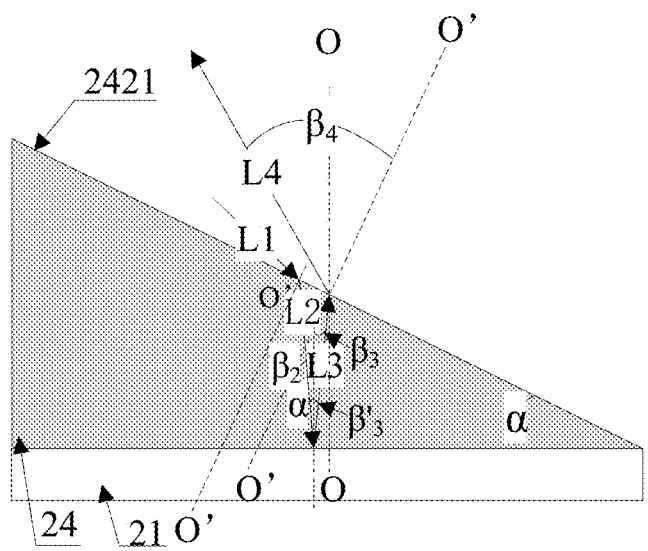
FIG. 29 is a schematic diagram of the light path when the emergence angle of the emergent light L4 is less than γ according to an embodiment of the disclosure.

Referring to FIG. 29, FIG. 29 is a schematic diagram of the light path when the emergence angle of the emergent light L4 is less than γ according to an embodiment of the disclosure.

$\alpha=\beta_3+\beta'_3$ can be obtained by the geometric calculation, to produce the angle of refraction $\beta_2=\alpha+\beta'_3$ of L2 on the inclined surface 2421, and then $\beta_2=2\alpha-\beta_3$ can be calculated.

Due to $\beta_4<\gamma$ and accordingly $\beta_3<\alpha$ and also due to $0<\beta_3<\theta$, but in the second case, due to α<θ, $0<\beta_3<\alpha$, and then $\alpha<\beta_2<2\alpha$ can be calculated.

In the case of 2α>θ, it is assumed that there is a critical angle δ of L3, so that $2\alpha-\delta=\theta$. At this time, the angle of emergence corresponding to L4 is denoted as γ'. Thus, when $\beta_3 \leq \gamma'$, $\beta_2=2\alpha-\beta_3 \geq \theta$, and at this time L1 cannot be incident above the inclined surface to obtain L2, and accordingly $\beta_4<\gamma'$; when $\beta_3>\gamma'$, $\beta_2=2\alpha-\beta_3<\theta$, and at this time L1 can be incident above the inclined surface to obtain L2, and accordingly $\beta_4 > \gamma'$. Thus the emergent light L4 corresponding to the incident light L1 above the inclined surface can emit from $\beta_4 > \gamma'$.

When $2\alpha < \theta$, L1 produces L2 under $\alpha < \beta_2 < \theta$, and it is in the bright state at this time.

That is, when $\alpha \leq \theta/2$ above the normal line O'O', L4 emits and it is in the bright state. When $\theta/2 < \alpha < \theta$, L4 emits under $\gamma' < \beta_4 < 90°$ and it is in the bright state; no L4 emits under $0 < \beta_4 < \gamma'$ and it is in the dark state.

Figure 30:
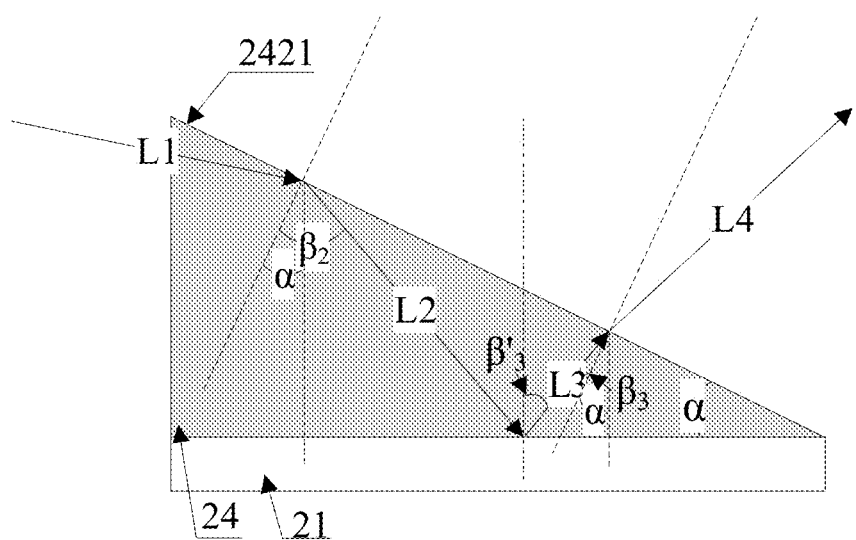
FIG. 30 is a second schematic diagram of the light path when the emergent light L4 emits from the inclined surface under the normal line O'O' according to an embodiment of the disclosure.

2. Referring to FIG. 30, FIG. 30 is a second schematic diagram of the light path when the emergent light L4 emits from the inclined surface under the normal line O'O' according to an embodiment of the disclosure.

$\alpha + \beta_3 = \beta = _3$ and $\beta_2 = \alpha + \beta'_3 = 2\alpha + \beta_3$ can be obtained by the geometric calculation.

Since $0 < \beta_3 < \theta$, $2\alpha < 2\alpha + \beta_3 < 2\alpha + \theta$, i.e., $2\alpha\beta_2 < 2\alpha + \theta$.

When $2\alpha > \theta$, $\beta_2 > \theta$, and at this time no L1 produces L2, that is, no L4 emits from the inclined surface 2421 and it is in the dark state.

When $2\alpha \leq \theta$, L1 produces L2 under $2\alpha < \beta_2 < \theta$, and no L1 produces L2 under $\theta \leq \beta_2 < 2\alpha + \theta$. Assume that the angle of incidence of L3 on the inclined surface 2421 is $\beta_3 = \theta - 2\alpha$ and the angle of emergence of L4 is $\gamma''$ when $\beta_2 = \theta$. When $\beta_4 \geq \gamma''$, $\beta_3 \geq \theta - 2\alpha$ and $\beta_2 \geq \theta$, and at this time no L1 produces L2 and it is in the dark state; when $\beta_4 < \gamma''$, $\beta_3 < \theta - 2\alpha$ and $\beta_2 < \theta$, and at this time L1 produces L2 and it is in the bright state.

That is, if $2\alpha > \theta$, no emergent light L4 exists under the normal line O'O' and it is in the dark state; if $2\alpha \leq \theta$, when being under the normal line O'O', no emergent light L4 emits to be in the dark state under $\gamma'' < \beta_4 < 90°$, and the emergent light L4 emits to be in the bright state under $0 < \beta_4 < \gamma''$.

Figure 31:
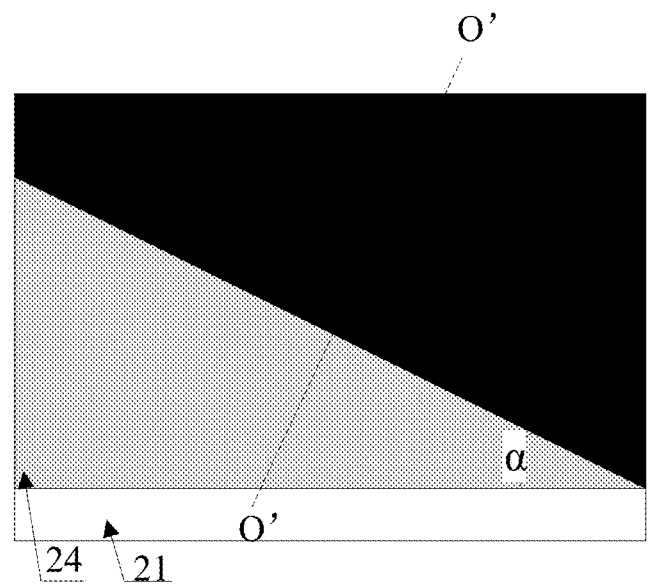
FIG. 31 is a schematic diagram of the distribution area of the emergent light L4 on the inclined surface of the light adjusting structure when $\alpha \geq 0$ according to an embodiment of the disclosure.
Figure 32:
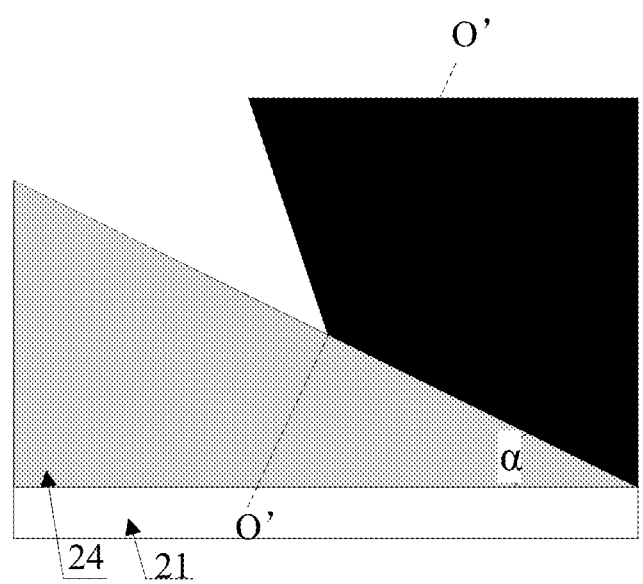
FIG. 32 is a schematic diagram of the distribution area of the emergent light L4 on the inclined surface of the light adjusting structure when $\theta/2 < \alpha < 0$ according to an embodiment of the disclosure.
Figure 33:
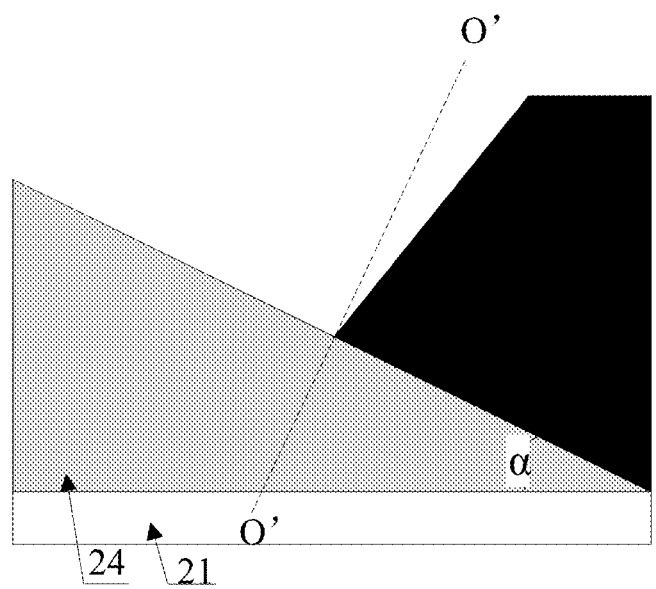
FIG. 33 is a schematic diagram of the distribution area of the emergent light L4 on the inclined surface of the light adjusting structure when $\alpha \leq \theta/2$ according to an embodiment of the disclosure.

Combining two cases described above, when $\alpha \geq \theta$, the light incident to the light adjusting structure 24 from the inclined surface 2421 may not produce the light emitting from the inclined surface 2421, to be in the dark state; when $\theta/2 < \alpha < \theta$, the emergent light exists in the less areas on the inclined surface 2421; when $\alpha \leq \theta/2$, the emergent light exists in the most areas on the inclined surface 2421. In one embodiment, referring to FIGS. 31 to 33, FIG. 31 is a schematic diagram of the distribution area of the emergent light L4 on the inclined surface of the light adjusting structure when $\alpha \geq \theta$ according to an embodiment of the disclosure, FIG. 32 is a schematic diagram of the distribution area of the emergent light L4 on the inclined surface of the light adjusting structure when $\theta/2 < \alpha < \theta$ according to an embodiment of the disclosure, and FIG. 33 is a schematic diagram of the distribution area of the emergent light L4 on the inclined surface of the light adjusting structure when $\alpha \leq \theta/2$ according to an embodiment of the disclosure. In FIGS. 31 to 33, the areas where the emergent light L4 exists are shown by the white areas, and the areas where no emergent light L4 exists are shown by the black areas.

Thus when the value range of the included angle $\alpha$ between the inclined surface 2421 of the light adjusting structure 24 and the plane where the drive circuit layer 21 is located is $\theta \leq \alpha < 90°$, the incident light incident to the light adjusting structure 24 may not emit from the inclined surface 2421 of the light adjusting structure 24, so that the interval region between the pixel structures 231 observed by the human eyes is in the dark state, to thereby increase the contrast of the solid-state total reflection display 2, and then increase the display effect of the solid-state total reflection display 2.

Figure 34:
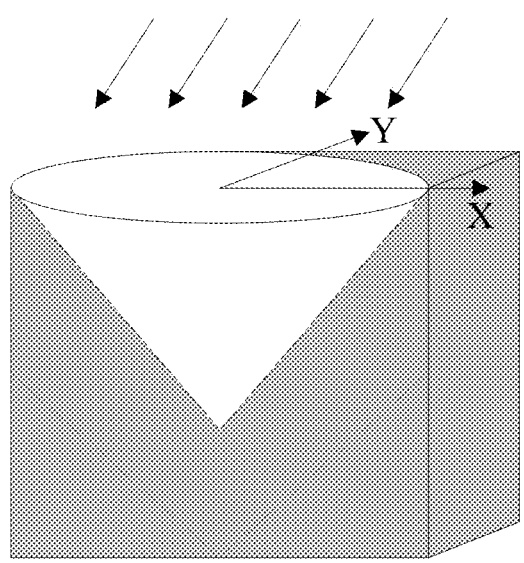
FIG. 34 is a three-dimension schematic diagram when the light adjusting structure is the notch according to an embodiment of the disclosure.

Referring to FIG. 34 which is a three-dimension schematic diagram when the light adjusting structure is the notch according to an embodiment of the disclosure, the notch is in a cone shape (shown by the white area in the dotted line in FIG. 34), wherein the bottom surface of the cone (shown by the white elliptic area in the XY plane) is located in the plane in which the opening of the notch is located.

By setting the notch to be in the cone shape and locating the bottom surface of the cone in the plane in which the opening of the notch is located, more light can enter the notch and then the reflection path of the more light is changed, so that less incident light within the coverage range of the light adjusting structures 24 is reflected into the range of visibility of the human eyes, to thereby lower the brightness within the coverage range of the light adjusting structures 24, darken the areas around the pixel structures 24, then increase the contrast of the solid-state total reflection display 2, and make the display effect better.

Figure 35:
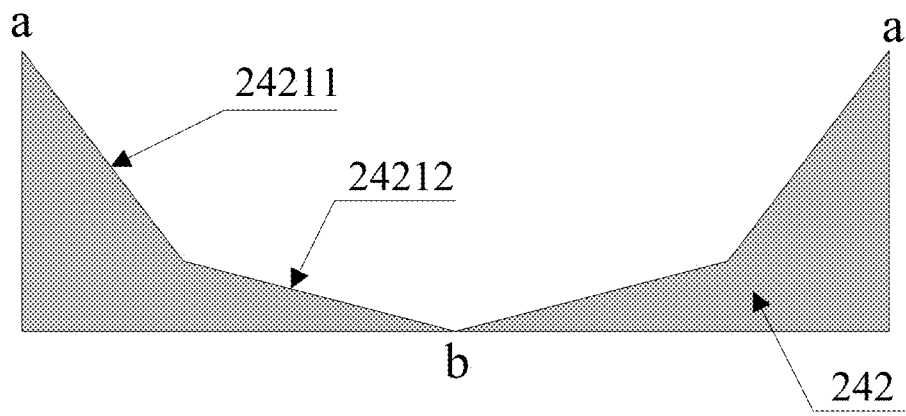
FIG. 35 is a first structural schematic diagram of the notch when the light adjusting structure is the notch according to an embodiment of the disclosure.

Referring to FIG. 35 which is a first structural schematic diagram of the notch when the light adjusting structure is the notch according to an embodiment of the disclosure, the notch includes the opposite side walls 242, and includes at least two inclined surfaces 2421 in the direction from the top 'a' to the bottom 'b' of the notch along the side walls 242, where the inclined surface 24211 close to the top 'a' has the maximum slope and the inclined surface 24212 close to the bottom 'b' has the minimum slope.

Since the notch has a certain depth where more light is incident on the inclined surface 24211 closer to the notch top 'a', the usage of the inclined surface 24211 with the larger slope can change the path of more light and decrease the amount of the light entering the range of visibility of the human eyes, to thereby lower the brightness of the light adjusting structure region; since less light is incident on the inclined surface 24212 closer to the notch bottom 'b', the usage of the inclined surface 24212 with the smaller slope at this time not only can change the reflection path of these light and decrease the amount of the light entering the range of visibility of the human eyes to thereby lower the brightness of the light adjusting structure region, but also can reduce the process difficulty.

It is necessary to note that FIG. 35 only shows the case that one side wall 242 has two inclined surfaces 24211 and 24212. In the practical application, one side wall 242 may have more inclined surfaces. The inclined surface 24211 here is the inclined surface closer to the top 'a' than the inclined surface 24212, and the inclined surface 24212 is the inclined surface closer to the bottom 'b' than the inclined surface 24211. The inclined surfaces 24211 and 24212 can be continuously adjacent as shown in FIG. 35, or can be separated by other inclined surfaces, but they all belong to the same side wall 242.

Figure 36:
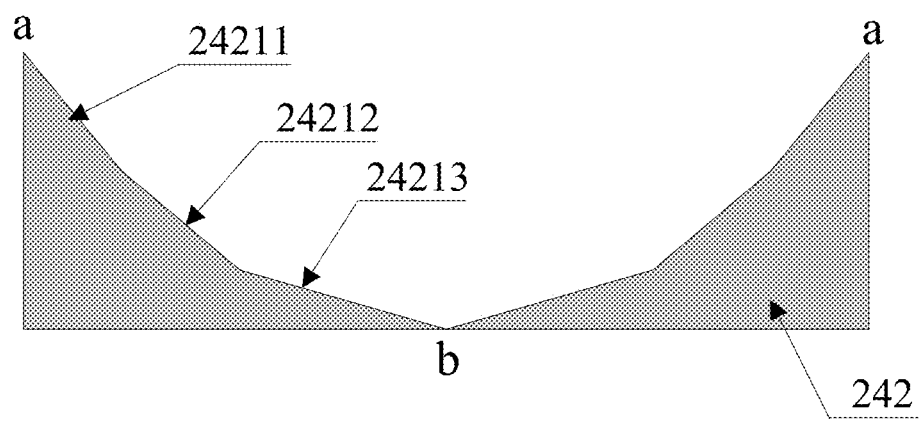
FIG. 36 is a second structural schematic diagram of the notch when the light adjusting structure is the notch according to an embodiment of the disclosure.

Referring to FIG. 36 which is a second structural schematic diagram of the notch when the light adjusting structure is the notch according to an embodiment of the disclosure, the notch includes the opposite side walls 242 each including a plurality of continuous sub-surfaces 24211~24213 which have gradually-decreased slopes in the direction from the top 'a' to the bottom 'b' of the notch along the side wall 242.

In an embodiment of the disclosure, by setting a plurality of continuous sub-surfaces 24211~24213 on the side wall 242 and gradually decreasing the slopes of the sub-surfaces 24211~24213 in the direction from the top 'a' to the bottom 'b' of the notch along the side wall 242, the sub-surfaces 24211 and 24212 close to the top 'a' of the notch can change the reflection path of more incident light and decrease the amount of the light entering the range of visibility of the human eyes to thereby lower the brightness of the light adjusting structure region, and the gradually-decreased slopes of the sub-surfaces 24211~24213 can reduce the process difficulty.

It is necessary to note that FIG. 36 shows that one side wall 242 has only three sub-surfaces, but in the practical application, one side wall 242 can have more than three sub-surfaces. In the case of more than three sub-surfaces, the slopes of the sub-surfaces still decrease gradually in the direction from the top 'a' to the bottom 'b' of the notch along the side wall 242.

Figure 37:
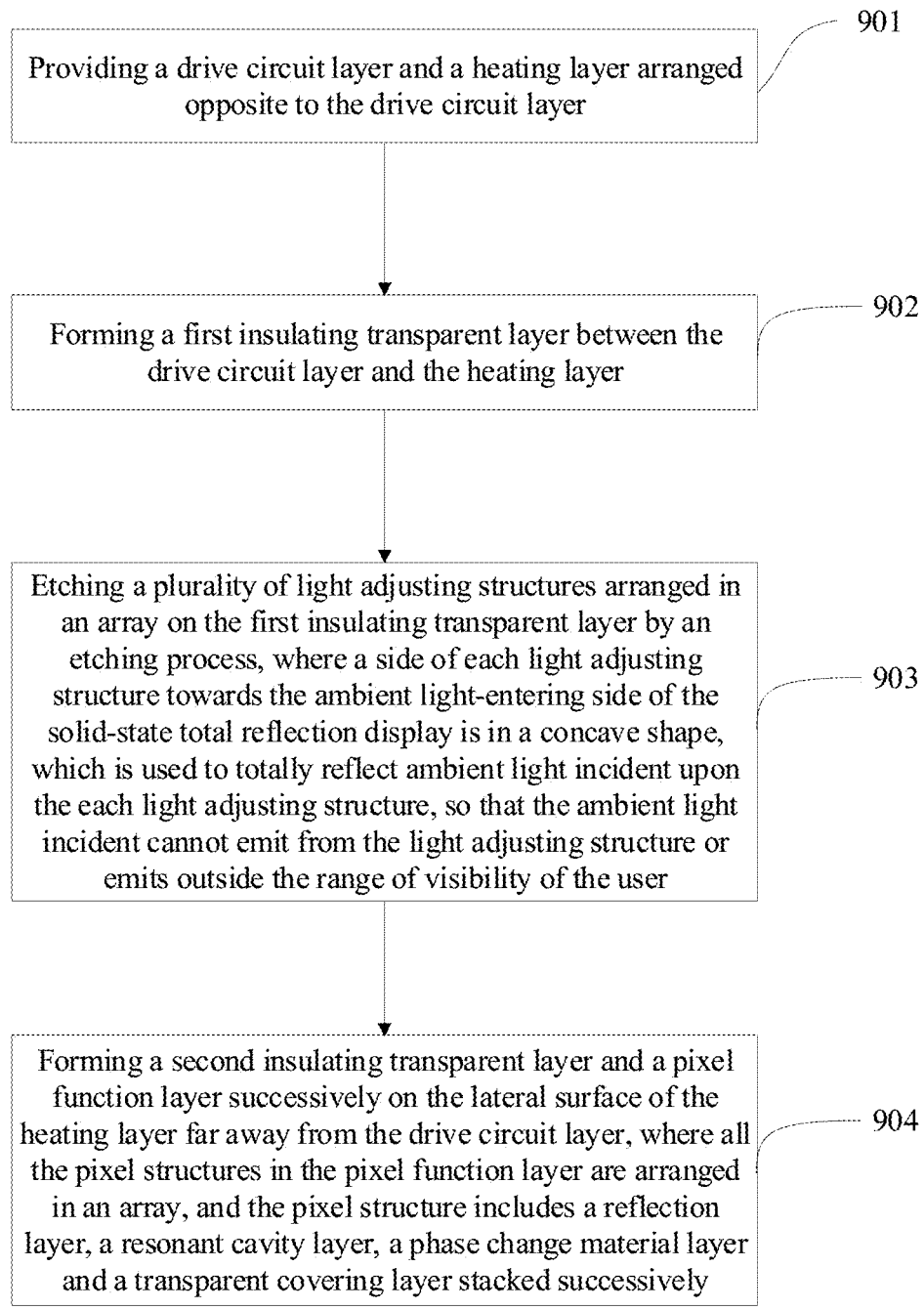
FIG. 37 is a flow chart of a method for manufacturing the solid-state total reflection display according to an embodiment of the disclosure.

Based upon the same inventive concept, an embodiment of the disclosure provides a manufacture method of a solid-state total reflection display. The structures of all the parts of the solid-state total reflection display manufactured by this method and the embodiments thereof can refer to the description of the solid-state total reflection display described above, and the repeated description thereof will be omitted here. Referring to FIG. 37 which is a flow chart of the manufacture method, the manufacture method includes:

Operation 901: providing a drive circuit layer and a heating layer arranged opposite to the drive circuit layer.

Operation 902: forming a first insulating transparent layer between the drive circuit layer and the heating layer.

Operation 903: etching a plurality of light adjusting structures arranged in an array on the first insulating transparent layer by an etching process, where a side of each light adjusting structure towards the ambient light-entering side of the solid-state total reflection display is in a concave shape, which is used to totally reflect a part of ambient light incident upon the each light adjusting structure, thus the part of ambient light cannot emit from the light adjusting structure or emits outside the range of visibility of the user.

Operation 904: forming a second insulating transparent layer and a pixel function layer successively on the lateral surface of the heating layer far away from the drive circuit layer, where all the pixel structures in the pixel function layer are arranged in an array, and the pixel structure includes a reflection layer, a resonant cavity layer, a phase change material layer and a transparent covering layer stacked successively.

What is claimed is:

1. A solid-state total reflection display, comprising:
a drive circuit layer;
a heating layer and a pixel function layer stacked successively on the drive circuit layer; wherein a plurality of pixel structures in the pixel function layer are arranged in an array, and the pixel structures each comprises a reflection layer, a resonant cavity layer, a phase change material layer and a transparent covering layer stacked successively; and
a plurality of light adjusting structures arranged between two adjacent pixel structures, among the plurality of pixel structures, in a row or column direction of the array; wherein a side of each light adjusting structure towards an ambient light-entering side of the solid-state total reflection display is in a concave shape.

2. The solid-state total reflection display of claim 1, wherein a pattern constituted of orthographic projections of the light adjusting structures in the solid-state total reflection display on the pixel function layer is in a grid-like structure, and meshes of grids in the grid-like structure each corresponds to a respective one of the pixel structures.

3. The solid-state total reflection display of claim 1, wherein the drive circuit layer comprises a reflective metal layer, an orthographic projection of the reflective metal layer on the pixel function layer overlaps an interval between the two adjacent pixel structures, and an orthographic projection of a heating element in the heating layer on the pixel function layer does not overlap the interval.

4. The solid-state total reflection display of claim 1, further comprising:
a first insulating transparent layer arranged between the drive circuit layer and the heating layer, the first insulating transparent layer forming the plurality of light adjusting structures.

5. The solid-state total reflection display of claim 4, further comprising:
a second insulating transparent layer arranged between the heating layer and the pixel function layer and covering the plurality of light adjusting structures in the first insulating transparent layer, wherein a part of the second insulating transparent layer covering the light adjusting structures depresses, along with the light adjusting structures, towards a direction of the drive circuit layer.

6. The solid-state total reflection display of claim 5, wherein ranges of refractive indexes of the first and second insulating transparent layers are 1.2~2.0.

7. The solid-state total reflection display of claim 1, wherein at least one light adjusting structure is comprised in an interval between a pair of the two adjacent pixel structures, and the light adjusting structure is a strip-like notch extending in a first direction parallel to an extending direction of the interval.

8. The solid-state total reflection display of claim 7, wherein when there are at least two light adjusting structures in the interval, the at least two light adjusting structures are arranged side by side in the interval.

9. The solid-state total reflection display of claim 1, wherein at least one light adjusting structure group is comprised in an interval between a pair of the two adjacent pixel structures, and the light adjusting structure group comprises a plurality of light adjusting structures arranged in a first direction parallel to an extending direction of the interval.

10. The solid-state total reflection display of claim 9, wherein,
the plurality of light adjusting structures in the light adjusting structure group comprise the notches and the concave spots respectively.

11. The solid-state total reflection display of claim 10, wherein when the plurality of light adjusting structures in the light adjusting structure group comprise the notches and the concave spots respectively, the notches and the concave spots are arranged alternately in the first direction parallel to the extending direction of the interval.

12. The solid-state total reflection display of claim 10, wherein when the plurality of light adjusting structures in the light adjusting structure group are all the notches, the plurality of light adjusting structures are arranged in the first direction, and the notches extend in a second direction perpendicular to the first direction.

13. The solid-state total reflection display of claim 9, wherein a plurality of light adjusting structure groups are comprised in the interval between the pair of the two adjacent pixel structures, and the light adjusting structure groups in the same interval are arranged in a third direction.

14. The solid-state total reflection display of claim 1, wherein when at least one light adjusting structure of the light adjusting structures is a concave spot, a concave space of the concave spot is in a rotator shape, and a center axis of the rotator is perpendicular to a plane in which the pixel function layer is located.

15. The solid-state total reflection display of claim 1, wherein when the plurality of light adjusting structures comprise notches and concave spots respectively, the concave spots are arranged at positions where intervals extending in a first direction intersect with intervals extending in a fourth direction, the fourth direction is unparallel to the first direction.

16. The solid-state total reflection display of claim 1, wherein when at least one light adjusting structure of the light adjusting structures is a strip-like notch extending in a first direction, the notch comprises opposite side walls which are symmetric about a center axis of the notch, and the center axis is parallel to the first direction.

17. The solid-state total reflection display of claim 1, wherein the light adjusting structure is a strip-like notch comprising opposite side walls which are camber surfaces or inclined surfaces; and in a direction of the inclined surface close to the pixel structures, an included angle $\alpha$ between the inclined surface and a plane in which the drive circuit layer is located has a value range of $\theta<\alpha<90°$, wherein $\theta$ is a critical angle at which light in the light adjusting structure is totally reflected on the inclined surface.

18. The solid-state total reflection display of claim 1, wherein when at least one light adjusting structure of the light adjusting structures is a notch, the notch comprises opposite side walls, a side wall of the side walls comprises at least two inclined surfaces in a direction from top to bottom of the notch along the side wall, wherein an inclined surface close to the top has a maximum slope and an inclined surface close to the bottom has a minimum slope.

19. The solid-state total reflection display of claim 1, wherein when at least one light adjusting structure of the light adjusting structures is a notch, the notch comprises opposite side walls, a side wall of the side walls comprises a plurality of continuous sub-surfaces which have gradually-decreased slopes in a direction from top to bottom of the notch along the side wall.

20. A method for manufacturing the solid-state total reflection display of claim 1, comprising:

providing a drive circuit layer and a heating layer arranged opposite to the drive circuit layer;

forming a first insulating transparent layer between the drive circuit layer and the heating layer;

etching a plurality of light adjusting structures arranged in an array on the first insulating transparent layer by an etching process, wherein a side of each light adjusting structure towards an ambient light-entering side of the solid-state total reflection display is in a concave shape, which is used to totally reflect ambient light incident on the each light adjusting structure so that the ambient light cannot emit from the each light adjusting structure or emits outside a range of visibility of a user; and forming a second insulating transparent layer and a pixel function layer successively on a lateral surface of the heating layer far away from the drive circuit layer, wherein pixel structures in the pixel function layer are arranged in an array, and the pixel structures each comprises a reflection layer, a resonant cavity layer, a phase change material layer and a transparent covering layer stacked successively.

21. A display device, comprising:

a solid-state total reflection display;

wherein the solid-state total reflection display comprises:

a drive circuit layer;

a heating layer and a pixel function layer stacked successively on the drive circuit layer; wherein a plurality of pixel structures in the pixel function layer are arranged in an array, and the pixel structures each comprises a reflection layer, a resonant cavity layer, a phase change material layer and a transparent covering layer stacked successively; and a plurality of light adjusting structures arranged between two adjacent pixel structures, among the plurality of pixel structures, in a row or column direction of the array; wherein a side of each light adjusting structure towards an ambient light-entering side of the solid-state total reflection display is in a concave shape.

* * * * *